United States Patent
Lee

(10) Patent No.: US 12,302,733 B2
(45) Date of Patent: May 13, 2025

(54) COLOR CONVERSION SUBSTRATE HAVING SIDE LIGHT BLOCKING MEMBER AND DISPLAY DEVICE INCLUDING THE SAME

(71) Applicant: SAMSUNG DISPLAY CO., LTD., Yongin-si (KR)

(72) Inventor: Kyung-Hun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 430 days.

(21) Appl. No.: 17/747,125

(22) Filed: May 18, 2022

(65) Prior Publication Data

US 2023/0130499 A1    Apr. 27, 2023

(30) Foreign Application Priority Data

Oct. 26, 2021   (KR) .................. 10-2021-0143713

(51) Int. Cl.
| | |
|---|---|
| H10K 59/38 | (2023.01) |
| H10K 50/84 | (2023.01) |
| H10K 50/858 | (2023.01) |
| H10K 50/86 | (2023.01) |
| H10K 59/122 | (2023.01) |

(52) U.S. Cl.
CPC ........... *H10K 59/38* (2023.02); *H10K 50/841* (2023.02); *H10K 50/858* (2023.02); *H10K 50/865* (2023.02); *H10K 59/122* (2023.02)

(58) Field of Classification Search
CPC .... H10K 59/38; H10K 50/841; H10K 59/122; H10K 50/858; H10K 50/865
See application file for complete search history.

(56) References Cited

U.S. PATENT DOCUMENTS

| | | | |
|---|---|---|---|
| 2014/0184972 A1* | 7/2014 | Park | G02F 1/133514 |
| | | | 349/106 |
| 2020/0142249 A1 | 5/2020 | Kawahira et al. | |
| 2020/0144333 A1* | 5/2020 | Kim | H01L 31/035218 |
| 2020/0217998 A1* | 7/2020 | Jung | G02B 5/201 |
| 2022/0206620 A1* | 6/2022 | Lee | H10K 71/00 |

FOREIGN PATENT DOCUMENTS

| | | |
|---|---|---|
| CN | 104865741 | 10/2018 |
| KR | 10-2016-0029491 | 3/2016 |
| KR | 10-2019-0014377 | 2/2019 |
| KR | 10-2250502 | 5/2021 |
| KR | 10-2266393 | 6/2021 |

* cited by examiner

*Primary Examiner* — Michael Jung
(74) *Attorney, Agent, or Firm* — F. CHAU & ASSOCIATES, LLC

(57) ABSTRACT

A color conversion substrate includes a base substrate having a display area and a peripheral area positioned around the display area. A color filter layer is disposed in the display area under the base substrate. A front light blocking member is disposed in the peripheral area under the base substrate and includes first light blocking layers. The first light blocking layers overlap each other in a first direction that is a thickness direction of the base substrate. A side light blocking member is disposed in the peripheral area under the base substrate and is disposed outside the front light blocking member to surround the front light blocking member.

20 Claims, 17 Drawing Sheets

COLOR CONVERSION SUBSTRATE HAVING SIDE LIGHT BLOCKING MEMBER AND DISPLAY DEVICE INCLUDING THE SAME

CROSS-REFERENCE TO RELATED APPLICATION(S)

This application claims priority under 35 U.S.C. § 119 to Korean Patent Application No. 10-2021-0143713, filed on Oct. 26, 2021 in the Korean Intellectual Property Office, the disclosure of which is incorporated by reference in its entirety herein.

TECHNICAL FIELD

Embodiments of the present inventive concept relate to a color conversion substrate and display device including the same.

DISCUSSION OF RELATED ART

Flat panel display devices have become increasingly popular as display devices over cathode ray tube display devices due to their lightweight and thin characteristics. Flat panel display devices include liquid crystal display devices and organic light emitting diode display devices.

A flat panel display device may include a display substrate having a plurality of pixels and a color conversion substrate including a color filter and a color conversion part. The color conversion part may convert a wavelength of light provided from the display substrate. Accordingly, light having a color that is different from a color of the incident light may be emitted from the color conversion part. For example, the color conversion part may include wavelength conversion particles, such as quantum dot and scattering particles for increasing a light path. However, the wavelength conversion particles and the scattering particles may emit light in all directions. Therefore, a side light leakage in which light is emitted from a side surface of the flat panel display may occur.

SUMMARY

Embodiments of the present inventive concept provide a color conversion substrate capable of preventing or reducing a side light leakage.

Embodiments of the present inventive concept also provide a display device capable of preventing or reducing a side light leakage.

Additional features of the inventive concepts will be set forth in the description which follows, and in part will be apparent from the description, or may be learned by practice of the inventive concepts.

According to an embodiment of the present inventive concept, a color conversion substrate includes a base substrate having a display area and a peripheral area positioned around the display area. A color filter layer is disposed in the display area under the base substrate. A front light blocking member is disposed in the peripheral area under the base substrate and includes first light blocking layers. The first light blocking layers overlap each other in a first direction that is a thickness direction of the base substrate. A side light blocking member is disposed in the peripheral area under the base substrate and is disposed outside the front light blocking member to surround the front light blocking member.

In an embodiment, the color filter layer may include a red color filter, a green color filter, and a blue color filter. The front light blocking member may include a first red light blocking layer, a first green light blocking layer, and a first blue light blocking layer overlapping each other in the first direction.

In an embodiment, the side light blocking member may include a first bank disposed outside the front light blocking member to surround the front light blocking member. The first bank including an organic material.

In an embodiment, a thickness of the first bank in the first direction may be greater than or equal to a thickness of the front light blocking member in the first direction.

In an embodiment, the display area may include light emitting areas and a light blocking area surrounding the light emitting areas. The color conversion substrate may further include an organic layer disposed in the light blocking area between the base substrate and the color filter layer. The organic layer may include an organic material. The first bank may include the same material as the organic layer.

In an embodiment, the side light blocking member may further include at least one second light blocking layer disposed outside the first bank to surround the first bank.

In an embodiment, a thickness of the at least one second light blocking layer in the first direction may be greater than or equal to a thickness of the front light blocking member in the first direction.

In an embodiment, a thickness of the second light blocking layer in the first direction may be greater than a width of the second light blocking layer in a second direction perpendicular to the first direction.

In an embodiment, the at least one second light blocking layer may include a second red light blocking layer, a second green light blocking layer, and a second blue light blocking layer overlapping each other in a second direction perpendicular to the first direction.

In an embodiment, the red color filter, the first red light blocking layer, and the second red light blocking layer may include the same material. The green color filter, the first green light blocking layer, and the second green light blocking layer may include the same material. The blue color filter, the first blue light blocking layer, and the second blue light blocking layer may include the same material.

In an embodiment, a thickness of the second red light blocking layer in the first direction may be greater than a thickness of the first red light blocking layer in the first direction. A thickness of the second green light blocking layer in the first direction may be greater than a thickness of the first green light blocking layer in the first direction. A thickness of the second blue light blocking layer in the first direction may be greater than a thickness of the first blue light blocking layer in the first direction.

In an embodiment, the side light blocking member may include a second bank disposed outside the at least one second light blocking layer to surround the at least one second light blocking layer. The side light blocking member may include an organic material.

In an embodiment, the first green light blocking layer may be disposed between the first red light blocking layer and the first blue light blocking layer in the first direction.

According to an embodiment of the present inventive concept, a color conversion substrate may include a base substrate including a display area and a peripheral area positioned around the display area. A color filter layer is disposed in the display area under the base substrate. A front light blocking member is disposed in the peripheral area under the base substrate and includes first light blocking layers. The first light blocking layers have different colors from each other and overlap each other in a first direction that is a thickness direction of the base substrate. A side light blocking member is disposed in the peripheral area under the base substrate and is disposed outside the front light blocking member. The side light blocking member includes second light blocking layers. The second light blocking layers may have different colors from each other, and may overlap each other in a second direction perpendicular to the first direction.

According to an embodiment of the present inventive concept, a display device may include a display substrate including a first base substrate and pixels disposed on the first base substrate. A color conversion substrate faces the display substrate. A sealing member couples the display substrate and the color conversion substrate to each other. The color conversion substrate may include a second base substrate including a display area and a peripheral area positioned around the display area. A color filter layer is disposed in the display area under the second base substrate. A front light blocking member is disposed in the peripheral area under the second base substrate and includes first light blocking layers. The first light blocking layers may overlap each other in a first direction that is a thickness direction of the second base substrate. A side light blocking member is disposed in the peripheral area under the second base substrate and is disposed outside the front light locking member to surround the front light blocking member.

In an embodiment, the sealing member may be disposed outside the side light blocking member to surround the side light blocking member.

In an embodiment, the display device may further include an optical sheet disposed under the display substrate. The optical sheet having a refractive index greater than a refractive index of the first base substrate.

In an embodiment, the first base substrate may be black.

In an embodiment, the front light blocking member may include a first red light blocking layer, a first green light blocking layer, and a first blue light blocking layer overlapping each other in the first direction. The side light blocking member may include a bank disposed outside the front light blocking member to surround the front light blocking member. The bank including an organic material.

In an embodiment, the side light blocking member may further include a second red light blocking layer, a second green light blocking layer, and a second blue light blocking layer. The second red light blocking layer, the second green light blocking layer, and the second blue light blocking layer may be disposed outside the bank to surround the bank, and may overlap each other in a second direction perpendicular to the first direction.

The display device according to embodiments may include the display substrate and the color conversion substrate. The color conversion substrate may include the front light blocking member disposed in the peripheral area to surround the display area, and the side light blocking member disposed in the peripheral area to surround the front light blocking member. The side light blocking member may effectively block light progressing outward from the front light blocking member. Accordingly, the side light leakage of the display device may be prevented or reduced.

It is to be understood that both the foregoing general description and the following detailed description are non-limiting and explanatory and are intended to provide further explanation of the present inventive concept.

BRIEF DESCRIPTION OF THE DRAWINGS

The accompanying drawings, which are included to provide a further understanding of the present inventive concept and are incorporated in and constitute a part of this specification, illustrate embodiments of the present inventive concept, and together with the description serve to explain the present inventive concept.

DETAILED DESCRIPTION OF EMBODIMENTS

Illustrative, non-limiting embodiments of the present inventive concept will be more clearly understood from the following detailed description in conjunction with the accompanying drawings.

Figure 1:
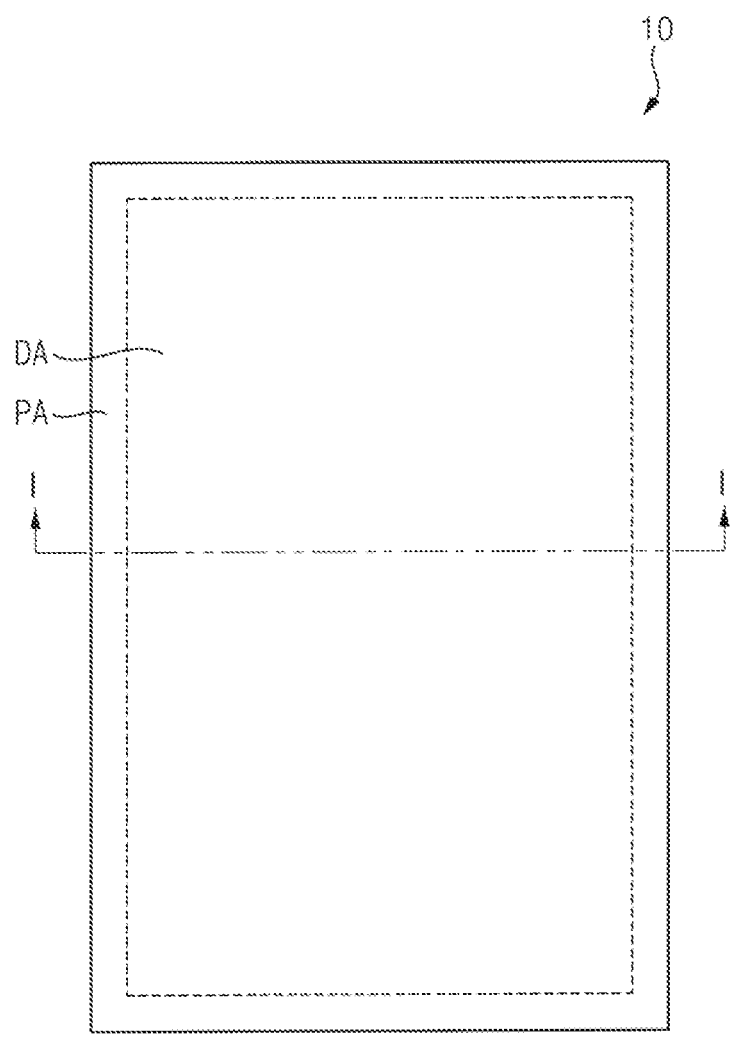
FIG. 1 is a plan view illustrating a display device according to an embodiment of the present inventive concept.
Figure 2:
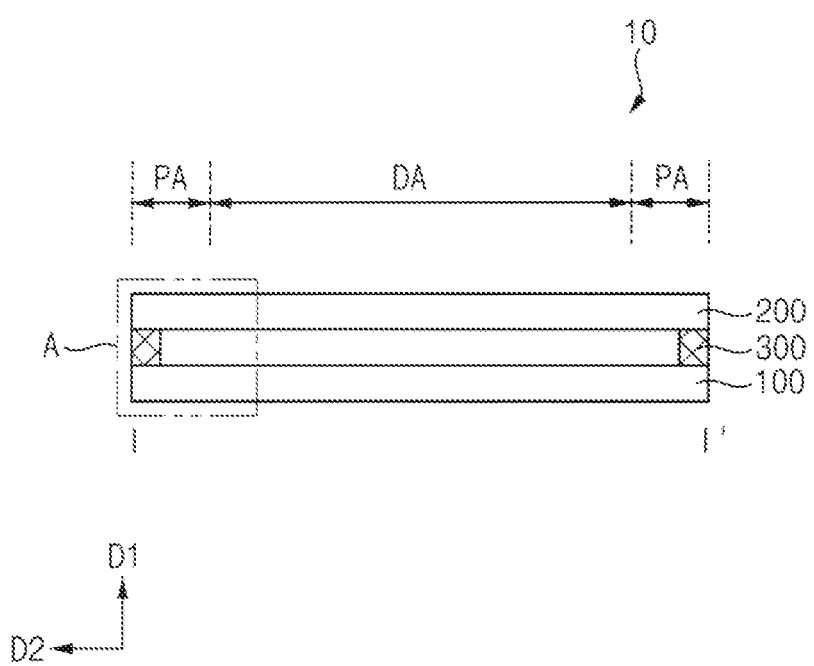
FIG. 2 is a cross-sectional view taken along line I-I' of FIG. 1 according to an embodiment of the present inventive concept.

FIG. 1 is a plan view illustrating a display device according to an embodiment FIG. 2 is a cross-sectional view taken along line I-I' of FIG. 1.

Referring to FIGS. 1 and 2, a display device 10 may include a first substrate 100, a second substrate 200, and a sealing member 300. The second substrate 200 may face the first substrate 100, and may be spaced a part in a first direction D1 that is a front direction of the display device 10 from the first substrate 100. The sealing member 300 may be disposed between the first substrate 100 and the second substrate 200 in the first direction D1. The sealing member 300 may couple the first substrate 100 and the second substrate 200 to each other.

The display device 10 (e.g., each of the first substrate 100 and the second substrate 200) may include a display area DA on which an image is displayed and a peripheral area PA positioned around the display area DA. The peripheral area PA may be positioned outside the display area DA. For example, the peripheral area PA may surround the display area DA in a plan view. In an embodiment, the peripheral area PA may completely surround the display area DA in a plan view. However, embodiments of the present inventive concept are not necessarily limited thereto and the peripheral area may not surround at least one side of the display area DA in some embodiments.

The first substrate 100 may include a plurality of pixels, and may be referred to as a display substrate. The pixels may be disposed in the display area DA of the first substrate 100. Each of the pixels may include a driving element and a light emitting element. The driving element may include at least one thin film transistor. The light emitting element may generate light based on a driving signal. For example, in an embodiment, the light emitting element may be an inorganic light emitting diode or an organic light emitting diode. However, embodiments of the present inventive concept are not necessarily limited thereto.

The second substrate 200 may include a color conversion part, and may be referred to as a color conversion substrate.

The color conversion part may be disposed in the display area DA, and may convert a wavelength of light generated from the light emitting element of the first substrate 100. The second substrate 200 may further include a color filter layer to transmit a light having a specific color (e.g., a light having a specific wavelength range).

The sealing member 300 may couple the first substrate 100 and the second substrate 200 to each other. The sealing member 300 may be disposed in the peripheral area PA between the first substrate 100 and the second substrate 200 (e.g., in the first direction D1). For example, the sealing member 300 may be disposed in the peripheral area PA between the first substrate 100 and the second substrate 200 to surround the display area DA in a plan view. For example, in an embodiment, the sealing member 300 may have a hollow rectangular shape (e.g., a rectangular frame shape) in a plan view. However, embodiments of the present inventive concept are not necessarily limited thereto, and the sealing member 300 may have various planar shapes, such as a shape corresponding to a planar shape of the first substrate 100 and/or the second substrate 200. For example, when the first substrate 100 and/or the second substrate 200 has a planar shape such as a triangle, a rhombus, a polygon, a circle, an oval, or the like, the sealing member 300 may have a hollow triangle, a hollow rhombus, a hollow polygon, a hollow circle, a hollow oval, or the like in a plan view.

In an embodiment, a filling member may be disposed between the first substrate 100 and the second substrate 200 (e.g., in the first direction D1). For example, the filling member may function as a buffer against external pressure applied to the display device 10. For example, the filling member may maintain a gap between the first substrate 100 and the second substrate 200.

Figure 3:
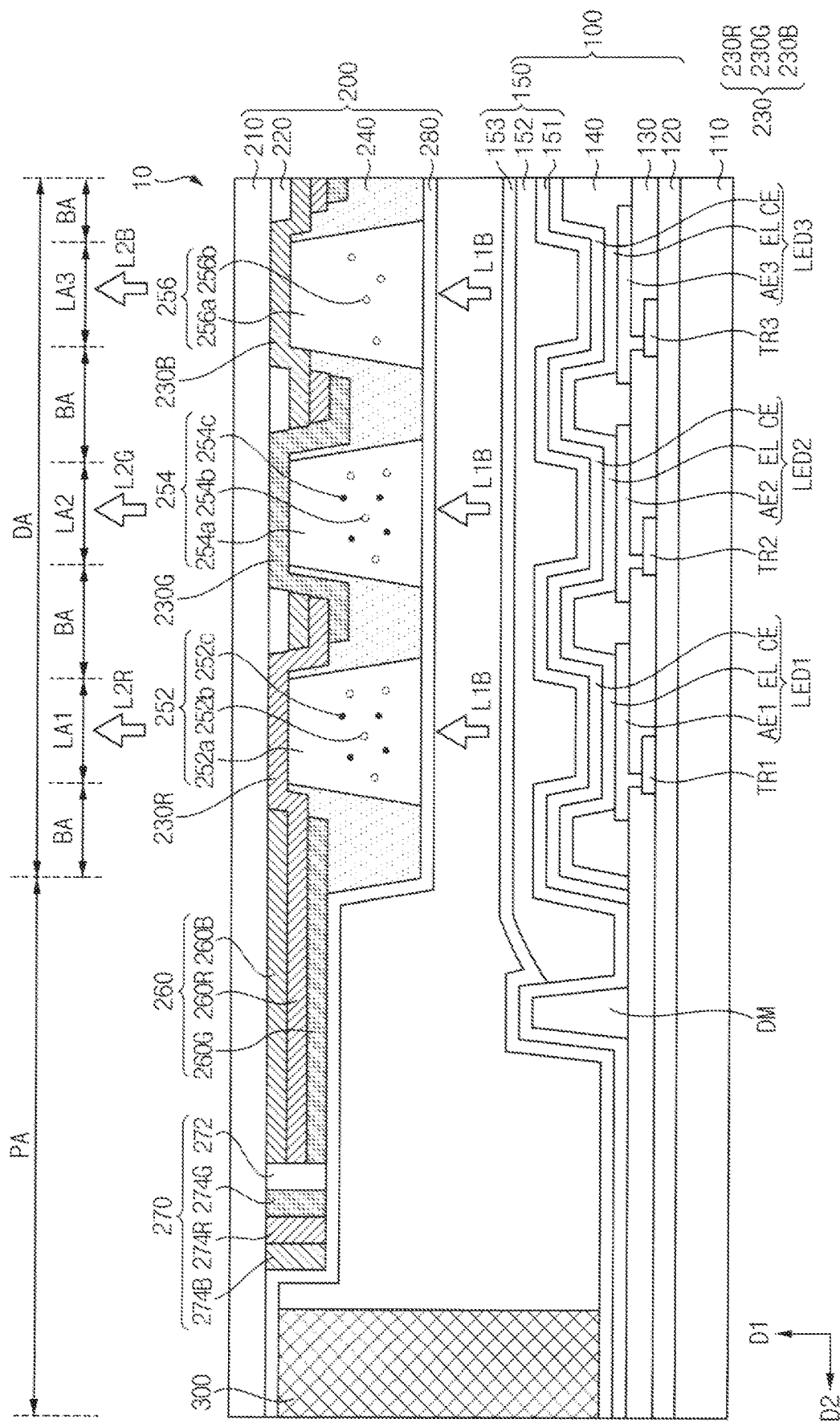
FIG. 3 is an enlarged cross-sectional view of area 'A' of FIG. 2 according to an embodiment of the present inventive concept.

FIG. 3 is an enlarged cross-sectional view of area 'A' of FIG. 2.

Referring to FIGS. 1 to 3, the display area DA may include a light emitting area and a light blocking area BA. A light L1B (hereinafter, an incident light L1B) generated by the first substrate 100 and incident into the second substrate 200 may be emitted to an outside through the light emitting area. For example, in an embodiment, the incident light L1B may have a blue color. However, embodiments of the present inventive concept are not necessarily limited thereto. The light emitting area may include first to third light emitting areas LA1, LA2, and LA3 for emitting light of different colors. For example, in an embodiment, the first light emitting area LA1 may emit a first transmitted light L2R having a red color, the second light emitting area LA2 may emit a second transmitted light L2G having a green color, and the third light emitting area LA3 may emit a third transmitted light L2B having a blue color. However, embodiments of the present inventive concept are not necessarily limited thereto and the number of the light emitting areas and the colors thereof may vary.

In an embodiment, the first to third light emitting areas LA1, LA2, and LA3 may be spaced apart from each other in a plan view (e.g., in a second direction D2), and may be arranged in a repeated sequence. In an embodiment, the second direction D2 may be perpendicular to the first direction D1. However, embodiments of the present inventive concept are not necessarily limited thereto and the second direction D2 may cross the first direction D1 at various different angles. The light blocking area BA may be positioned around the first to third light emitting areas LA1, LA2, and LA3 in a plan view. For example, the light blocking area BA may have a grid shape in a plan view and the light blocking area BA may surround the first to third light emitting areas LA1, LA2, and LA3 in a plan view.

In an embodiment, the first substrate 100 may include a first base substrate 110, a buffer layer 120, first to third driving elements TR1, TR2, TR3, an insulating structure 130, a pixel defining layer 140, first to third light emitting elements LED1, LED2, and LED3, and an encapsulation layer 150.

In an embodiment, the first base substrate 110 may be an insulating substrate formed of a transparent or opaque material. In an embodiment, the first base substrate 110 may include glass. In this embodiment, the first substrate 100 may be a rigid display substrate. However, embodiments of the present inventive concept are not necessarily limited thereto. For example, in an embodiment, the first base substrate 110 may include plastic. In this embodiment, the first substrate 100 may be a flexible display substrate.

In an embodiment, the first base substrate 110 may include a light blocking material. For example, at least a portion of the first base substrate 110 may include a light blocking material such as black pigment, dye, carbon black, or the like. For example, the first base substrate 110 may be black.

The buffer layer 120 may be disposed on the first base substrate 110 (e.g., directly thereon in the first direction D1). The buffer layer 120 may prevent or reduce impurities such as oxygen or moisture from diffusing to an upper portion of the first base substrate 110 through the first base substrate 110. In an embodiment, the buffer layer 120 may include an inorganic insulating material such as a silicon compound, a metal oxide, or the like. Examples of the inorganic insulating material may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. However, embodiments of the present inventive concept are not necessarily limited thereto. The compounds can be used alone or in a combination thereof. The buffer layer 120 may have a single-layered structure or a multi-layered structure including a plurality of insulating layers.

The first to third driving elements TR1, TR2, and TR3 may be disposed in the display area DA on the buffer layer 120 (e.g., directly thereon in the first direction D1). Each of the first to third driving elements TR1, TR2, and TR3 may include at least one thin film transistor. A channel layer of the thin film transistor may include an oxide semiconductor, a silicon semiconductor, an organic semiconductor, or the like. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like. However, embodiments of the present inventive concept are not necessarily limited thereto.

The insulating structure 130 may cover the first to third driving elements TR1, TR2, and TR3. In an embodiment, the insulating structure 130 may include a combination of an inorganic insulating layer and an organic insulating layer.

First to third pixel electrodes AE1, AE2, and AE3 may be disposed on the insulating structure 130 (e.g., directly thereon in the first direction D1). Each of the first to third pixel electrodes AE1, AE2, and AE3 may include a conductive material such as a metal, an alloy, a conductive metal nitride, a conductive metal oxide, a transparent conductive material, or the like. Each of the first to third pixel electrodes AE1, AE2, and AE3 may have a single-layered structure or a multi-layered structure including a plurality of conductive layers.

In an embodiment, the first to third pixel electrodes AE1, AE2, and AE3 may be electrically connected to the first to third driving elements TR1, TR2, and TR3 through contact holes formed in the insulating structure 130, respectively.

The pixel defining layer 140 may be disposed on the first to third pixel electrodes AE1, AE2, and AE3. The pixel defining layer 140 may include an organic insulating material. Examples of the organic insulating material include a photoresist, a polyacryl-based resin, a polyimide-based resin, a polyamide-based resin, a siloxane-based resin, an acryl-based resin, an epoxy-based resin, or the like. However, embodiments of the present inventive concept are not necessarily limited thereto. These materials can be used alone or in a combination thereof. The pixel defining layer 140 may define pixel openings respectively exposing at least a portion of each of the first to third pixel electrodes AE1, AE2, and AE3. For example, in an embodiment, the pixel defining layer 140 may cover lateral sides of the first to third pixel electrodes AE1, AE2, and AE3 and a central portion of the first to third pixel electrodes AE1, AE2 and AE3 (e.g., in the second direction D2) may be exposed by the pixel defining layer 140.

An emission layer EL may be disposed on the portions of the first to third pixel electrodes AE1, AE2, and AE3 exposed by the pixel openings defined by the pixel defining layer 140. In an embodiment, the emission layer EL may continuously extend over the plurality of pixels in the display area DA. However, embodiments of the present inventive concept are not necessarily limited thereto. For example, in an embodiment, the emission layer EL may be separated from an emission layer of an adjacent pixel.

The emission layer EL may include at least one of an organic light emitting material or quantum dot. In an embodiment, the emission layer EL may generate a blue light. However, embodiments of the present inventive concept are not necessarily limited thereto. For example, the emission layer EL may generate a red light, a green light, or the like. In an embodiment, the emission layer EL may generate lights having different colors in different pixels.

In an embodiment, functional layers such as a hole injection layer, a hole transport layer, an electron transport layer, and an electron injection layer may be disposed on an upper portion and/or a lower portion of the emission layer EL.

A common electrode CE may be disposed on the emission layer EL (e.g., in the first direction D1). In an embodiment, the common electrode CE may include a conductive material such as a metal, an alloy, a conductive metal nitride, a conductive metal oxide, a transparent conductive material, or the like. However, embodiments of the present inventive concept are not necessarily limited thereto. The common electrode CE may have a single-layered structure or a multi-layered structure including a plurality of conductive layers. In an embodiment, the common electrode CE may continuously extend over the plurality of pixels in the display area DA. However, embodiments of the present inventive concept are not necessarily limited thereto.

The first pixel electrode AE1, the emission layer EL, and the common electrode CE may form the first light emitting element LED1. The second pixel electrode AE2, the emission layer EL, and the common electrode CE may form the second light emitting element LED2. The third pixel electrode AE3, the emission layer EL, and the common electrode CE may form the third light emitting element LED3.

The encapsulation layer 150 may be disposed on the common electrode CE (e.g., directly thereon in the first direction D1). The encapsulation layer 150 may include at least one inorganic encapsulation layer and at least one organic encapsulation layer. In an embodiment, the encapsulation layer 150 may include a first inorganic encapsulation layer 151 disposed on the common electrode CE, an organic encapsulation layer 152 disposed on the first inorganic encapsulation layer 151, and a second inorganic encapsulation layer 153 disposed on the organic encapsulation layer 152. However, embodiments of the present inventive concept are not necessarily limited thereto.

In an embodiment, a dam DM may be disposed in the peripheral area PA on the first base substrate 110. For example, the dam DM may surround the display area DA in a plan view. The dam DM may prevent an organic material from overflowing to an outside of the dam DM (e.g., in a second direction D2 in FIG. 3) during a formation of the organic encapsulation layer 152.

The second substrate 200 may be disposed to be spaced apart in the first direction D1 from the encapsulation layer 150. Hereinafter, the first direction D1 may be referred to as a front direction or a thickness direction.

In an embodiment, the second substrate 200 may include a second base substrate 210, an organic layer 220, a color filter layer 230, a partition wall 240, a first color conversion part 252, a second color conversion part 254, a transmission part 256, a front light blocking member 260, a side light blocking member 270, and a capping layer 280.

In an embodiment, the second base substrate 210 may be an insulating substrate formed of a transparent material. For example, the second base substrate 210 may include glass or plastic. The second base substrate 210 may include the display area DA and the peripheral area PA.

The organic layer 220 may be disposed in the display area DA under the second base substrate 210 (e.g., directly thereunder in a direction opposite to the first direction D1). In an embodiment, the organic layer 220 may overlap the light blocking area BA (e.g., in the first direction D1), and may not overlap the first to third light emitting areas LA1, LA2, and LA3 (e.g., in the first direction D1). For example, the organic layer 220 may define the light blocking area BA and the first to third light emitting areas LA1, LA2, and LA3 in the display area DA. In an embodiment, the organic layer 220 may be formed of a transparent or opaque organic material. However, embodiments of the present inventive concept are not necessarily limited thereto. For example, in an embodiment, the organic layer 220 may also overlap the first to third light emitting areas LA1, LA2, and LA3 (e.g., in the first direction D1).

The color filter layer 230 may be disposed in the display area DA under the second base substrate 210 (e.g., directly thereunder in a direction opposite to the first direction D1). In an embodiment, the color filter layer 230 may include a red color filter 230R, a green color filter 230G, and a blue color filter 230B. However, embodiments of the present inventive concept are not necessarily limited thereto and the colors of the filters of the color filter layer 230 may vary.

The red color filter 230R may overlap the first light emitting area LA1, and may selectively transmit red light. The green color filter 230G may overlap the second light emitting area LA2, and may selectively transmit green light. The blue color filter 230B may overlap the third light emitting area LA3, and may selectively transmit blue light.

In an embodiment, each of the red color filter 230R, the green color filter 230G, and the blue color filter 230B may further overlap the light blocking area BA. For example, as illustrated in FIG. 3, the red color filter 230R may overlap the first light emitting area LA1 and the light blocking area BA, and may not overlap the second and third light emitting areas LA2 and LA3. The green color filter 230G may overlap the second light emitting area LA2 and the light blocking area BA, and may not overlap the first and third light emitting areas LA1 and LA3. The blue color filter 230B may overlap the third light emitting area LA3 and the light blocking area BA, and may not overlap the first and second light emitting areas LA1 and LA2. In this embodiment, in the light blocking area BA, a portion of the red color filter 230R, a portion of the green color filter 230G, and a portion of the blue color filter 230B may overlap each other in the first direction D1. Accordingly, color mixing of the adjacent first to third light emitting areas LA1, LA2, and LA3 adjacent to each other may be prevented or reduced.

The partition wall 240 may be disposed in the display area DA under the color filter layer 230 (e.g., directly thereunder in a direction opposite to the first direction D1). A plurality of openings may be formed in the partition wall 240. For example, as illustrated in FIG. 3, the openings of the partition wall 240 may expose the first to third light emitting areas LA1, LA2, and LA3, respectively. The partition wall 240 may form a space to receive an ink composition for forming the first color conversion part 252, the second color conversion part 254, and the transmission part 256. For example, the partition wall 240 may entirely overlap the light blocking area BA, and may have a grid shape in a plan view.

In an embodiment, the partition wall 240 may include an organic material. In an embodiment, the partition wall 240 may further include a light blocking material. For example, at least a portion of the partition wall 240 may include a light blocking material such as black pigment, dye, carbon black, or the like. However, embodiments of the present inventive concept are not necessarily limited thereto and the composition of the light blocking material may vary.

The first color conversion part 252, the second color conversion part 254, and the transmission part 256 may be disposed in the display area DA under the color filter layer 230, and may overlap the first to third light emitting areas LA1, LA2 and LA3, respectively. For example, the first color conversion part 252, the second color conversion part 254, and the transmission part 256 may be disposed in the openings of the partition wall 240, respectively.

The first color conversion part 252 may overlap the first light emitting area LA1. The first color conversion part 252 may convert the incident light L1B having a blue color to the first transmitted light L2R having a red color. For example, in an embodiment as shown in FIG. 3, the first color conversion part 252 may include a resin part 252a, scattering particles 252b, and wavelength conversion particles 252c.

The scattering particles 252b may scatter the incident light L1B without substantially changing the wavelength of the incident light. Therefore, a path of a light progressing in (e.g., progressing through) the first color conversion part 252 may be increased. In an embodiment, the scattering particles 252b may include a metal oxide, an organic material, or the like. However, embodiments of the present inventive concept are not necessarily limited thereto. For example, in an embodiment, the scatterers 252b may be omitted.

In an embodiment, each of the wavelength conversion particles 252c may include a quantum dot. The quantum dot may be defined as a nano-crystalline semiconductor material. The quantum dot may absorb an incident light and emit a light having a wavelength different from a wavelength of the incident light. In an embodiment, the quantum dot may have a diameter (e.g., an average particle size) less than or equal to about 100 nm. However, embodiments of the present inventive concept are not necessarily limited thereto. In an embodiment, the quantum dot may have a diameter of in a range of about 1 nm to about 20 nm. However, embodiments of the present inventive concept are not necessarily limited thereto. In an embodiment, each of the wavelength conversion particles 252c may include a quantum dot that absorbs blue light and emits red light.

The scattering particles 252b and the wavelength conversion particle 252c may be disposed in the resin part 252a. For example, in an embodiment, the resin part 252a may include an epoxy-based resin, an acryl-based resin, a phenol-based resin, a melamine-based resin, a cardo-based resin, an imide-based resin, or the like. However, embodiments of the present inventive concept are not necessarily limited thereto.

The first color conversion part 252 may convert the incident light L1B having a blue color to emit the first transmitted light L2R having a red color. A remainder of the blue light, which is not converted by the first color conversion part 252, may be blocked by the red color filter 230R. Accordingly, in the first light emitting area LA1, the first transmitted light L2R having a red color may be emitted to the outside (e.g., in the first direction D1) passing through the second base substrate 210.

The second color conversion part 254 may overlap the second light emitting area LA2. The second color conversion part 254 may convert the incident light L1B having a blue color to the second transmitted light L2G having a green color. For example, the second color conversion part 254 may include a resin part 254a, scattering particles 254b, and wavelength conversion particles 254c. In an embodiment, the resin part 254a and the scattering particles 254b of the second color conversion part 254 may be substantially the same as or similar to the resin part 252a and the scattering particles 252b of the first color conversion part 252.

For example, each of the wavelength conversion particles 254c of the second color conversion part 254 may include a quantum dot that absorbs blue light and emits green light. Accordingly, the second color conversion part 254 may convert the incident light L1B having a blue color to emit the second transmitted light L2R having a green color. A remainder of the blue light, which is not converted by the second color conversion part 254, may be blocked by the green color filter 230G. Accordingly, in the second light emitting area LA2, the second transmitted light L2G having a green color may be emitted to the outside (e.g., in the first direction D1) passing through the second base substrate 210.

The transmission part 256 may overlap the third light emitting area LA3. For example, the transmission part 256 may include a resin part 256a and scattering particles 256b. In an embodiment, the resin part 256a and the scattering particles 256b of the transmission part 256 may be substantially the same as or similar to the resin part 252a and the scattering particles 252b of the first color conversion part 252.

The transmission part 256 may not convert the incident light L1B having a blue color. For example, the transmission part 256 may emit the third transmitted light L2B substantially the same as (e.g., substantially the same wavelength as) the incident light L1B. Accordingly, in the third light emitting area LA3, the third transmitted light L2B having a blue color may be emitted to the outside (e.g., in the first direction D1) passing through the second base substrate 210.

As the first to third transmitted lights L2R, L2G, and L2B emitted to the outside passing through the second base substrate 210 may be combined, the image may be displayed in the display area DA.

The front light blocking member 260 may be disposed in the peripheral area PA under the second base substrate 210 (e.g., directly thereunder in a direction opposite to the first direction D1). For example, the front light blocking member 260 may be disposed in the peripheral area PA under the second base substrate 210 to surround the display area DA in a plan view. However, embodiments of the present inventive concept are not necessarily limited thereto and a portion of the front light blocking member 260 may extend to the display area DA in some embodiments. The front light blocking member 260 may prevent or reduce circuit structures such as wirings, a driving circuit, or the like disposed in the peripheral area PA of the first substrate 100 from being viewed from the outside of the display device 10. In addition, the front light blocking member 260 may prevent or reduce a front light leakage in which light reflected from the circuit structure or light emitted from the display area DA passes through the peripheral area PA of the second base substrate 210 and is emitted in the front direction (e.g., in the first direction D1).

The front light blocking member 260 may include a plurality of first light blocking layers. The first light blocking layers may overlap each other in the first direction D1. For example, in an embodiment, the front light blocking member 260 may include a first red light blocking layer 260R, a first green light blocking layer 260G, and a first blue light blocking layer 260B. However, embodiments of the present inventive concept are not necessarily limited thereto. As illustrated in FIG. 3, the first red light blocking layer 260R, the first green light blocking layer 260G, and the first blue light blocking layer 260B may overlap each other in the first direction D1. Accordingly, the front light blocking member 260 may effectively block light progressing in the first direction D1.

The side light blocking member 270 may be disposed in the peripheral area PA under the second base substrate 210 (e.g., directly thereunder in a direction opposite to the first direction D1), and may be disposed outside the front light blocking member 260. For example, the side light blocking member 270 may be spaced apart from the front light blocking member 260 (e.g., in the second direction D2) and may be positioned farther from the display area DA than the front light blocking member 260. For example, the side light blocking member 270 may be disposed in the peripheral area PA under the second base substrate 210 to surround the front light blocking member 260 in a plan view. The side light blocking member 270 may prevent or reduce a side light leakage in which light reflected from the circuit structure or light emitted from the display area DA passes through the front light blocking member 260 and is emitted in an outward direction (e.g., in the second direction D2 in FIG. 3).

The side light blocking member 270 may include a bank 272. In an embodiment, the side light blocking member 270 may further include at least one second light blocking layer. The bank 272 and the second light blocking layer may overlap each other in the second direction D2.

In an embodiment, the bank 272 may include an organic material, and may be disposed outside the front light blocking member 260 to surround the front light blocking member 260 in a plan view. For example, the bank 272 may directly contact an outer lateral side surface of the front light blocking member 260.

In an embodiment, a thickness of the bank 272 in the first direction D1 may be greater than or equal to a thickness of the front light blocking member 260 in the first direction D1. For example, the thickness of the bank 272 in the first direction D1 may be greater than each of a thickness of the first red light blocking layer 260R in the first direction D1, a thickness of the first green light blocking layer 260G in the first direction D1, and a thickness of the first blue light blocking layer 260B in the first direction D1.

In an embodiment, the bank 272 may include substantially the same material as the organic layer 220 disposed in the display area DA. For example, the thickness of the bank 272 in the first direction D1 may be greater than a thickness of the organic layer 220 in the first direction D1.

The second light blocking layer may be disposed outside the bank 272 to surround the bank 272 in a plan view. In an embodiment, a thickness of the second light blocking layer in the first direction D1 may be greater than or equal to a thickness of the front light blocking member 260 in the first direction D1. In an embodiment, a thickness of the second light blocking layer in the first direction D1 may be greater than a width of the second light blocking layer in the second direction D2. However, embodiments of the present inventive concept are not necessarily limited thereto.

In an embodiment, as illustrated in FIG. 3, the side light blocking member 270 may include a second red light blocking layer 274R, a second green light blocking layer 274G, and a second blue light blocking layer 274B. The second green light blocking layer 274G may surround the bank 272 in a plan view. The second red light blocking layer 274R may surround the second green light blocking layer 274G in a plan view. The second blue light blocking layer 274B may surround the second red light blocking layer 274R in a plan view. For example, the bank 272, the second green light blocking layer 274G, the second red light blocking layer 274R, and the second blue light blocking layer 274B may overlap each other in the second direction D2. The bank 272, the second green light blocking layer 274G, the second red light blocking layer 274R and the second blue light blocking layer 274B may be consecutively arranged (e.g., in the second direction D2). Accordingly, the side light blocking member 270 may effectively block light progressing from the front light blocking member 260 in the second direction D2 (e.g., in the outward direction).

In an embodiment, each of a thickness of the second red light blocking layer 274R in the first direction, a thickness of the second green light blocking layer 274G in the first direction, and a thickness of the second blue light blocking layer 274B in the first direction may be greater than or equal to the thickness of the front light blocking member 260 in the first direction D1. For example, the thickness of the second red light blocking layer 274R in the first direction D1 may be greater than the thickness of the first red light blocking layer 260R in the first direction D1. The thickness of the second green light blocking layer 274G in the first direction D1 may be greater than the thickness of the first green light blocking layer 260G in the first direction D1. The thickness of the second blue light blocking layer 274B in the first direction D1 may be greater than the thickness of the first blue light blocking layer 260B in the first direction D1. For example, as shown in an embodiment of FIG. 3, the bank 272, the second red light blocking layer 274R, the second green light blocking layer 274G, and the second blue light blocking layer 274B may have substantially the same or similar thickness to each other. As shown in an embodiment of FIG. 3, the sum of the thicknesses of the first blue light blocking layer 260B, the first red light blocking layer 260R and the first green light blocking layer 260G in the first direction D1 may be substantially equal to the thicknesses of each of the bank 272, the second red light blocking layer 274R, the second green light blocking layer 274G, and the second blue light blocking layer 274B in the first direction D1. However, embodiments of the present inventive concept are not necessarily limited thereto.

In an embodiment, the second red light blocking layer 274R may include substantially the same material as the red color filter 230R and the first red light blocking layer 260R. The second green light blocking layer 274G may include substantially the same material as the green color filter 230G and the first green light blocking layer 260G. The second blue light blocking layer 274B may include substantially the same material as the blue color filter 230B and the first blue light blocking layer 260B.

The capping layer 280 may be disposed under the second base substrate 210. In an embodiment, the capping layer 280 may be disposed in an entirety of the display area DA and the peripheral area PA. For example, the capping layer 280 may cover the partition wall 240, the first color conversion part 252, the second color conversion part 254, the transmission part 256, the front light blocking member 260, and the side light blocking member 270 under the second base substrate 210. In an embodiment, the capping layer 280 may include an inorganic insulating material.

The sealing member 300 may be disposed in the peripheral area PA between the first substrate 100 and the second substrate 200 (e.g., in the first direction D1). For example, the sealing member 300 may be disposed outside the side light blocking member 270 to surround the side light blocking member 270 in a plan view. The sealing member 300 may couple the first substrate 100 and the second substrate 200 to each other.

In some instances, light reflected from the circuit structure or light emitted from the display area DA passes through the front light blocking member 260 and is emitted in the outward direction (e.g., in the second direction D2 in FIG. 3). For example, light reflected from the circuit structure or light emitted from the display area DA may be incident into the first green light blocking layer 260G positioned at the lower most portion of the front light blocking member 260. A portion of the incident light (e.g., green light) may progress in the outward direction inside the first green light blocking layer 260G, and may be emitted from the first green light blocking layer 260G in the outward direction. In a comparative embodiment in which the side light blocking member 270 does not exist, green light emitted outward from the first green light blocking layer 260G may be incident into the sealing member 300. In this comparative embodiment, when the sealing member 300 includes a transparent material or when the sealing member 300 does not have a sufficient width in the second direction D2 even though the sealing member 300 includes an opaque material, a side light leakage in which the green light is emitted from the sealing member 300 to the outside of the display device 10 may occur.

However, in an embodiment of the present inventive concept, the second substrate 200 may include the side light blocking member 270 surrounding the front light blocking member 260. The side light blocking member 270 may effectively block light progressing from the front light blocking member 260 in the outward direction (e.g., in the second direction D2 in FIG. 3). Accordingly, the side light leakage of the display device 10 may be prevented or reduced.

FIGS. 4 to 8 are cross-sectional views illustrating a method of manufacturing a color conversion substrate included in the display device of FIG. 3.

Hereinafter, a method of manufacturing the second substrate 200 included in the display device 10 of FIG. 3 will be briefly described with reference to FIGS. 4 to 8.

Figure 4:
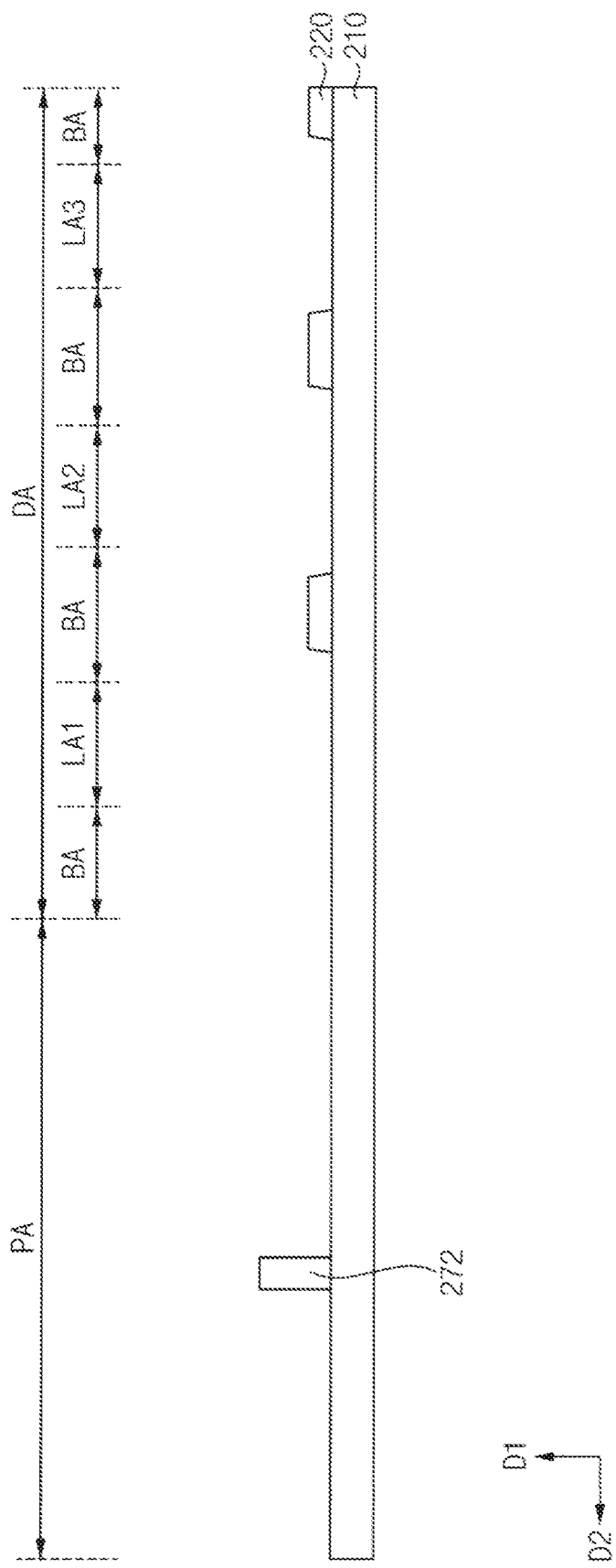
FIGS. 4 to 8 are cross-sectional views illustrating a method of manufacturing a color conversion substrate included in the display device of FIG. 3 according to embodiments of the present inventive concept.

First, referring to FIG. 4, the organic layer 220 may be formed in the display area DA on the second base substrate 210. The bank 272 may be formed in the peripheral area PA on the second base substrate 210. The organic layer 220 may be formed to overlap the light blocking area BA. The bank 272 may be spaced apart from the display area DA to surround the display area DA.

In an embodiment, the organic layer 220 and the bank 272 may be substantially simultaneously formed with each other. A thickness of the bank 272 in the first direction D1 may be greater than a thickness of the organic layer 220 in the first direction D1. For example, in an embodiment, the organic layer 220 and the bank 272 having different thicknesses may be substantially simultaneously formed with each other by differently controlling inkjet printing process conditions (e.g., a discharge amount of droplets) depending on the location. However, embodiments of the present inventive concept are not necessarily limited thereto. For example, in an embodiment, after forming a pre-organic layer, the organic layer 220 and the bank 272 having different thicknesses may be substantially simultaneously formed with each other by patterning the pre-organic layer using a halftone mask. However, embodiments of the present inventive concept are not necessarily limited thereto.

Figure 5:
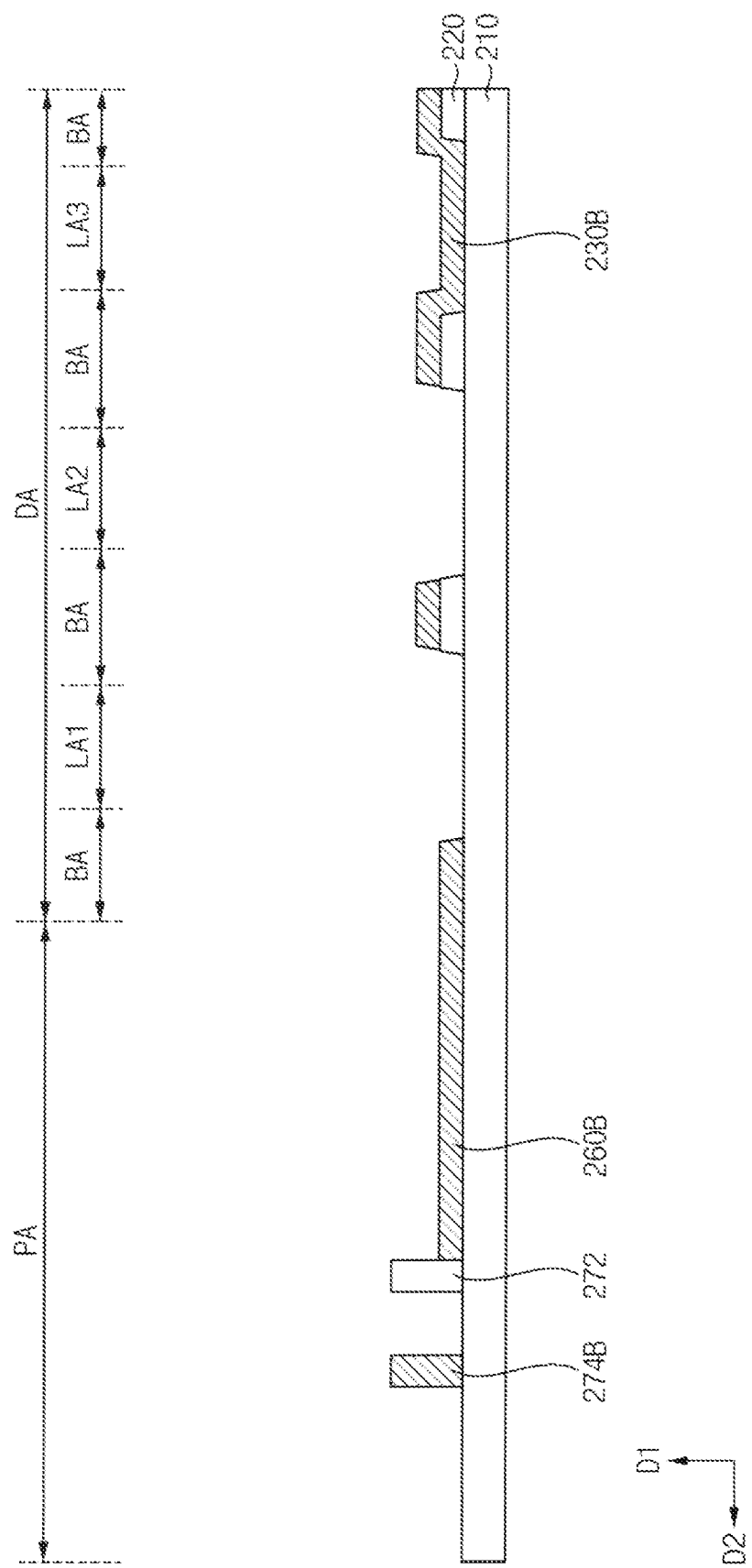

Referring to FIG. 5, the blue color filter 230B may be formed in the display area DA on the second base substrate 210 and the organic layer 220 (e.g. directly thereon in the first direction D1). The first blue light blocking layer 260B and the second blue light blocking layer 274B may be formed in the peripheral area PA on the second base substrate 210 (e.g. directly thereon in the first direction D1). The blue color filter 230B may be formed to overlap the third light emitting area LA3 and the light blocking area BA (e.g., in the first direction D1). The first blue light blocking layer 260B may be formed to surround the display area DA inside the bank 272. For example, the first blue light blocking layer 260B may be spaced apart from the bank 272 (e.g., in a direction opposite to the second direction D2) and may be disposed closer to the display area DA than the bank 272. The second blue light blocking layer 274B may be spaced apart from the bank 272 to surround the bank 272. For example, the second blue light blocking layer 274B may be spaced apart from the bank 272 in the second direction D2 and may be disposed farther from the display area DA than the bank 272.

In an embodiment, the blue color filter 230B, the first blue light blocking layer 260B, and the second blue light blocking layer 274B may be substantially simultaneously formed with each other. A thickness of the second blue light blocking layer 274B in the first direction D1 may be greater than each of a thickness of the blue color filter 230B in the first direction D1 and a thickness of the first blue light blocking layer 260B in the first direction D1. For example, in an embodiment, the blue color filter 230B, the first blue light blocking layer 260B, and the second blue light blocking layer 274B having different thicknesses may be substantially simultaneously formed with each other by differently controlling inkjet printing process conditions (e.g., a discharge amount of droplets) depending on the location. However, embodiments of the present inventive concept are not limited thereto.

Figure 6:
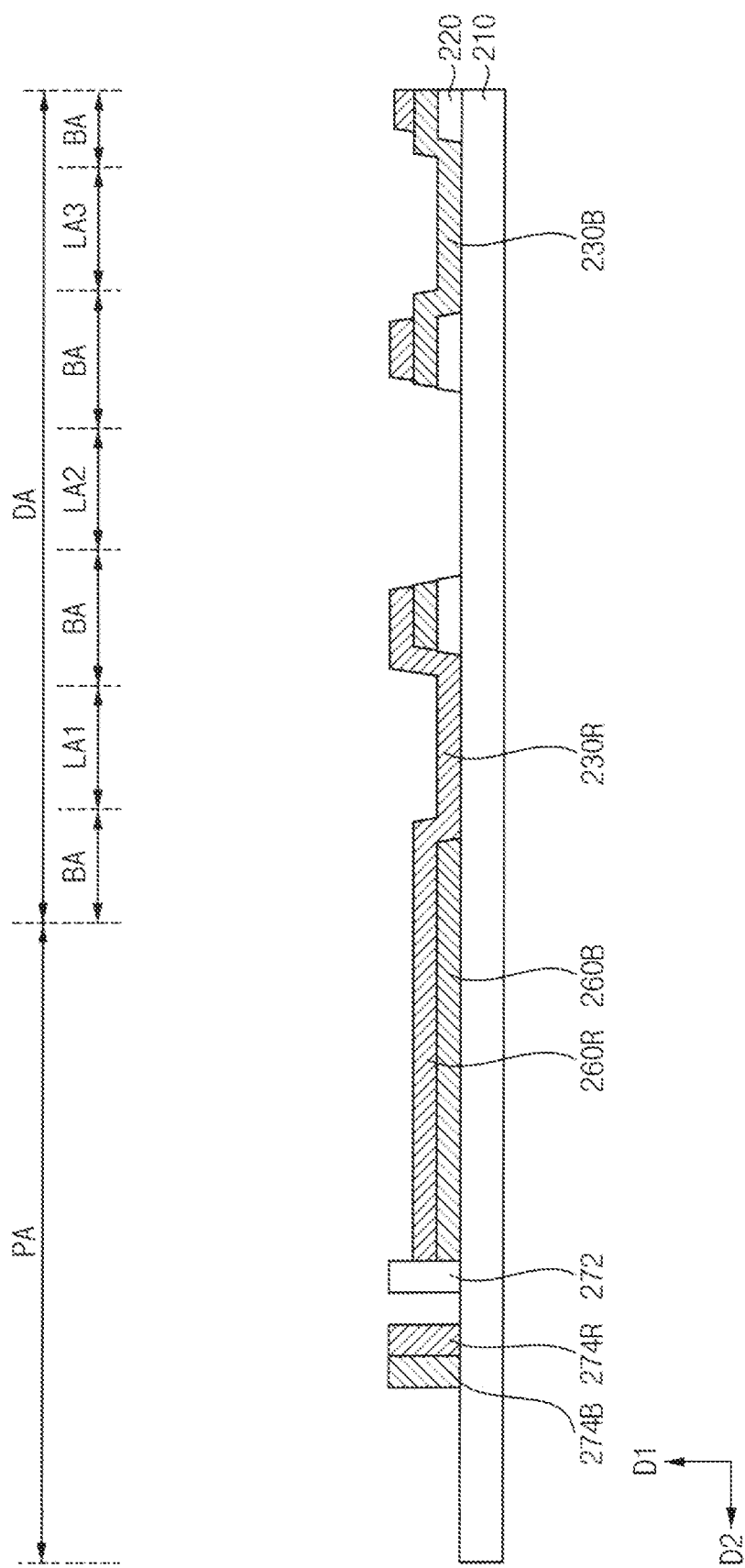

Referring to FIG. 6, the red color filter 230R may be formed in the display area DA on the second base substrate 210 (e.g., directly thereon in the first direction D1). The first red light blocking layer 260R and the second red light blocking layer 274R may be formed in the peripheral area PA on the second base substrate 210. The red color filter 230R may be formed to overlap the first light emitting area LA1 and the light blocking area BA (e.g., in the first direction D1). The first red light blocking layer 260R may be formed on the first blue light blocking layer 260B (e.g., directly thereon in the first direction D1). The second red light blocking layer 274R may be formed between the bank 272 and the second blue light blocking layer 274B (e.g., in the second direction D2). The second red light blocking layer 274R may be spaced apart from the bank 272 to surround the bank 272. For example, the second red light blocking layer 274R may be spaced apart from the bank 272 in the second direction D2 and may be disposed farther from the display area DA than the bank 272.

In an embodiment, the red color filter 230R, the first red light blocking layer 260R, and the second red light blocking layer 274R may be substantially simultaneously formed with each other. A thickness of the second red light blocking layer 274R in the first direction D1 may be greater than each of a thickness of the red color filter 230R in the first direction D1 and a thickness of the first red light blocking layer 260R in the first direction D1. For example, in an embodiment, the red color filter 230R, the first red light blocking layer 260R, and the second red light blocking layer 274R having different thicknesses may be substantially simultaneously formed with each other by differently controlling inkjet printing process conditions (e.g., a discharge amount of droplets) depending on the location. However, embodiments of the present inventive concept are not necessarily limited thereto.

Figure 7:
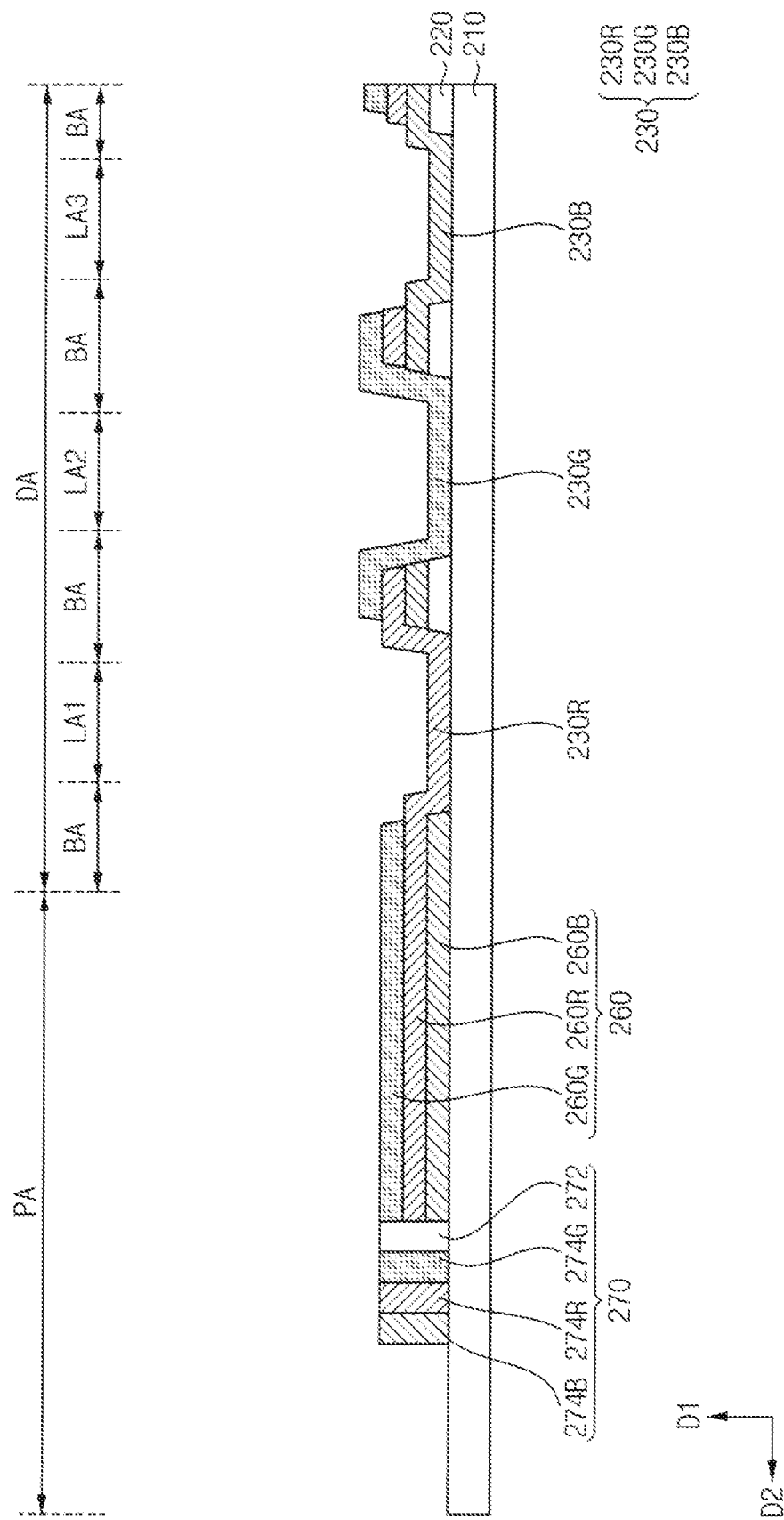

Referring to FIG. 7, the green color filter 230G may be formed in the display area DA on the second base substrate 210 (e.g., directly thereon in the first direction D1). The first green light blocking layer 260G and the second green light blocking layer 274G may be formed in the peripheral area PA on the second base substrate 210. The green color filter 230G may be formed to overlap the second light emitting area LA2 and the light blocking area BA (e.g., in the first direction D1). The first green light blocking layer 260G may be formed on the first red light blocking layer 260R (e.g., directly thereon in the first direction D1). The second green light blocking layer 274G may be formed between the bank 272 and the second red light blocking layer 274R (e.g., in the second direction D2) to surround the bank 272.

In an embodiment, the green color filter 230G, the first greenlight blocking layer 260G, and the second green light blocking layer 274G may be substantially simultaneously formed with each other. A thickness of the second green light blocking layer 274G in the first direction D1 may be greater than each of a thickness of the green color filter 230G in the first direction D1 and a thickness of the first green light blocking layer 260G in the first direction D1. For example, in an embodiment, the green color filter 230G, the first green light blocking layer 260G, and the second green light blocking layer 274G having different thicknesses may be substantially simultaneously formed with each other by differently controlling inkjet printing process conditions (e.g., a discharge amount of droplets) depending on the location. However, embodiments of the present inventive concept are not necessarily limited thereto.

Figure 8:
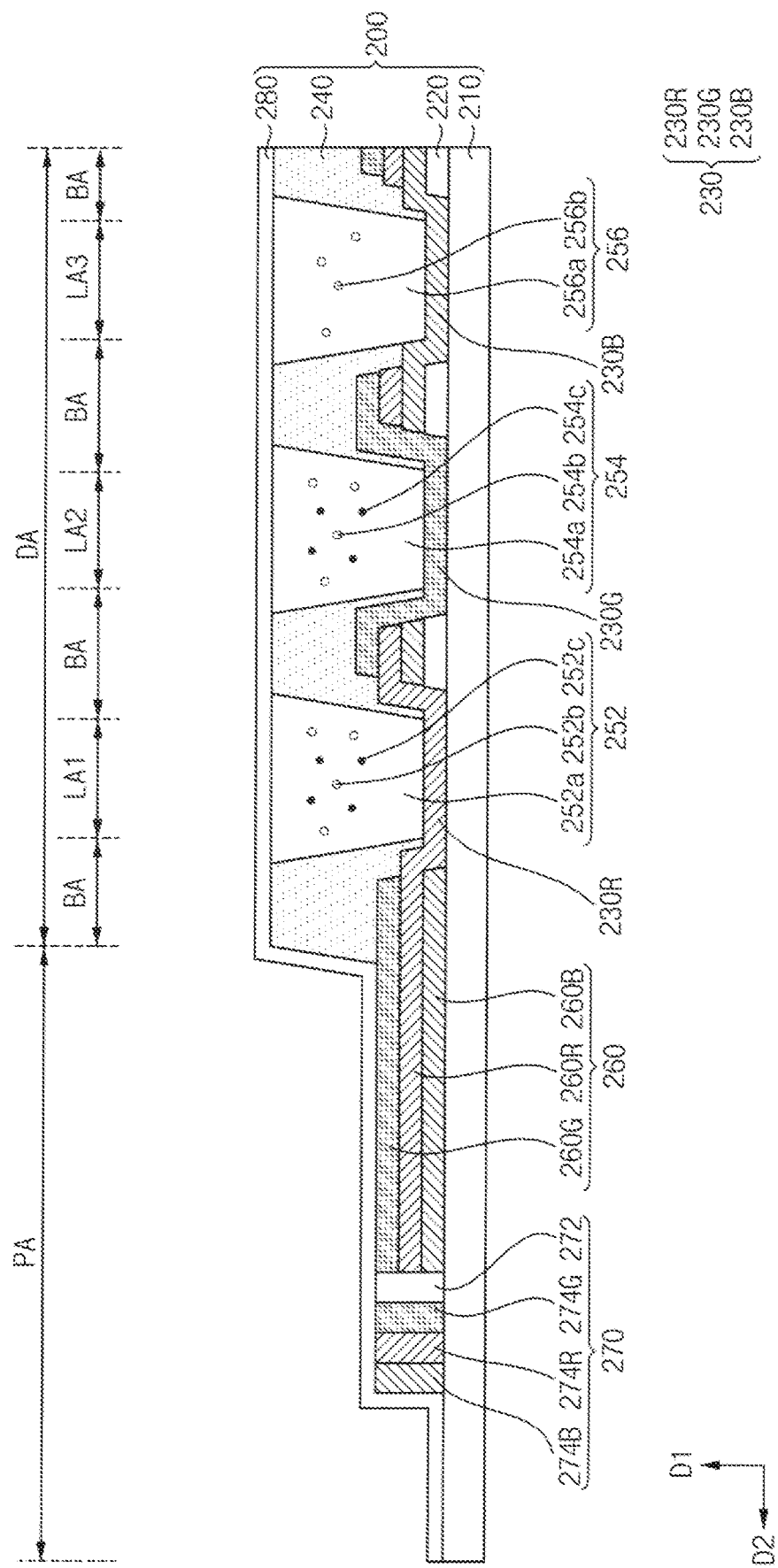

Referring to FIG. 8, the partition wall 240 may be formed in the display area DA on the color filter layer 230 (e.g., directly thereon in the first direction D1). Subsequently, the openings respectively exposing the first to third light emitting areas LA1, LA2, and LA3 may be formed in the partition wall 240. The first color conversion part 252, the second color conversion part 254, and the transmission part 256 may be formed in the openings of the partition wall 240, respectively. Subsequently, the capping layer 280 covering the partition wall 240, the first color conversion part 252, the second color conversion part 254, the transmission part 256, the front light blocking member 260, and the side light blocking member 270 may be formed.

In an embodiment, the second substrate 200 may include the side light blocking member 270 surrounding the front light blocking member 260. The side light blocking member 270 may block light progressing outward (e.g., in the second direction D2) from the front light blocking member 260. Accordingly, the side light leakage of the display device 10 may be prevented or reduced. In addition, the side light blocking member 270 may be substantially simultaneously formed with the organic layer 220 and the color filter layer 230 formed in the display area DA of the second substrate 200. Accordingly, a manufacturing cost and a manufacturing time of the display device 10 may be reduced.

FIGS. 9 to 16 are cross-sectional views illustrating display devices according to embodiments of the present inventive concept.

For example, each of FIGS. 9 to 16 may correspond to FIG. 3. Hereinafter, display devices according to embodiments will be described with reference to FIGS. 9 to 16. In the following description, differences from the display device described with reference to FIG. 3 will be mainly described, and repeated descriptions will be omitted or simplified.

Figure 9:
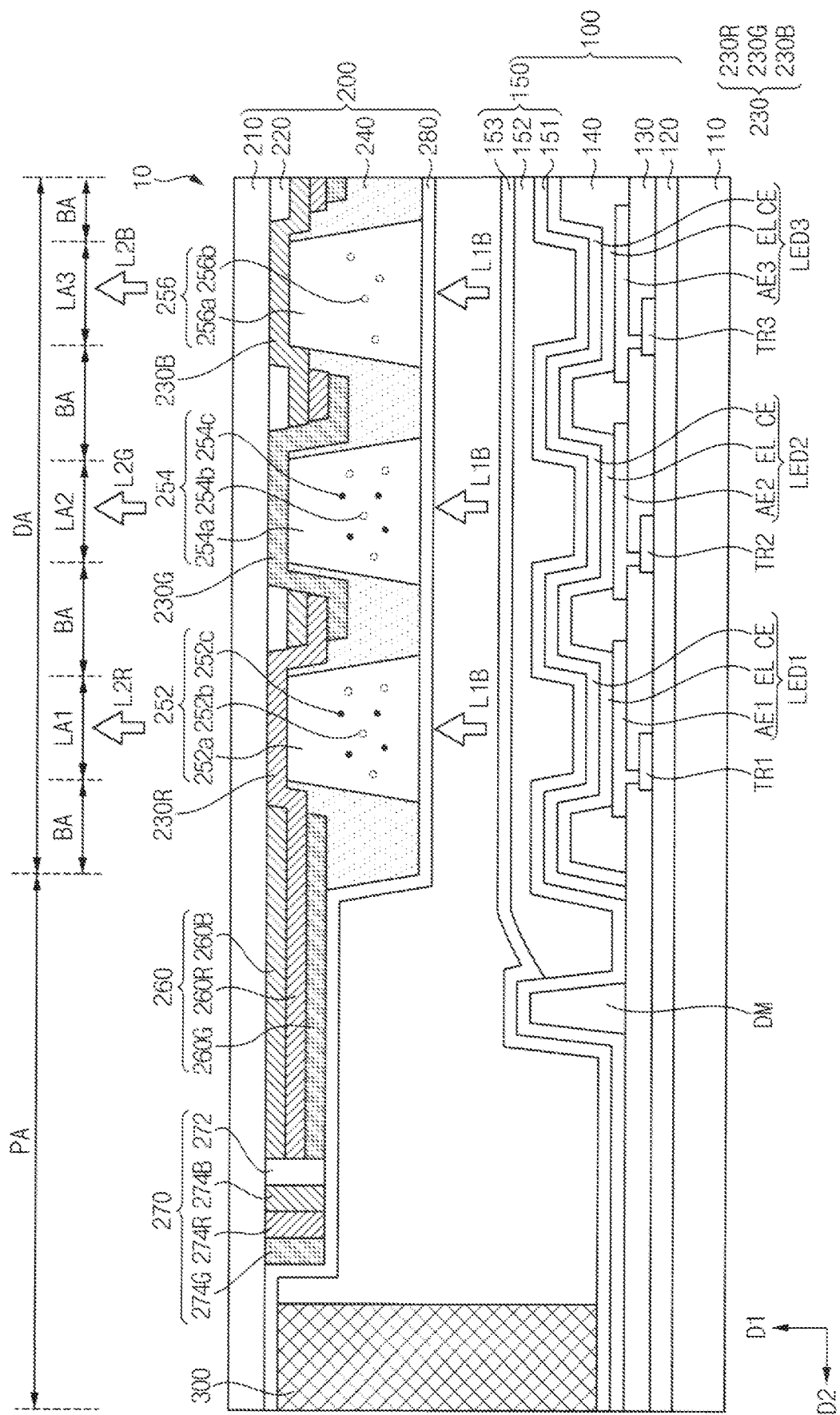
FIGS. 9 to 16 are cross-sectional views illustrating display devices according to embodiments of the present inventive concept.

Referring to FIG. 9, in an embodiment, the second blue light blocking layer 274B may surround the bank 272 in a plan view, and the second red light blocking layer 274R may surround the second blue light blocking layer 274B in a plan view, and the second green light blocking layer 274G may surround the second red light blocking layer 274R in a plan view. For example, the second blue light blocking layer 274B may be formed immediately adjacent to and surrounding the bank 272 (e.g., in the second direction D2). The second red light blocking layer 274R may be formed adjacent to and surrounding the second blue light blocking layer 274B (e.g., in the second direction D2). The second green light blocking layer 274G may be formed adjacent to and surrounding the second red light blocking layer 274R (e.g., in the second direction D2). However, embodiments of the present inventive concept are not limited thereto, and the second red light blocking layer 274R, the second green light blocking layer 274G, and the second blue light blocking layer 274B may be disposed in various combinations to overlap each other in the second direction D2. Additionally, the sequence in the manufacturing process that each of the second blocking layers are formed may vary.

Figure 10:
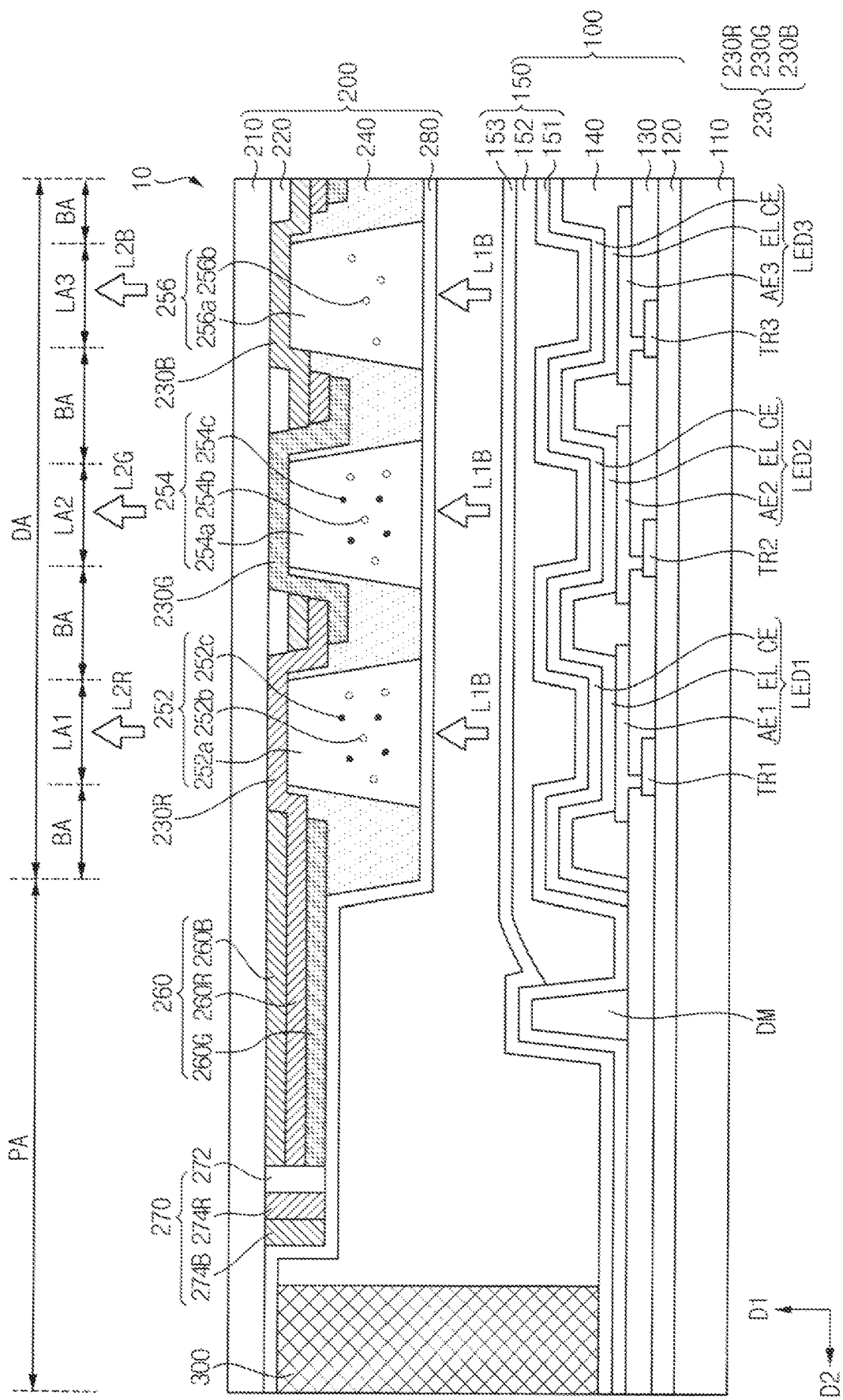
Figure 11:
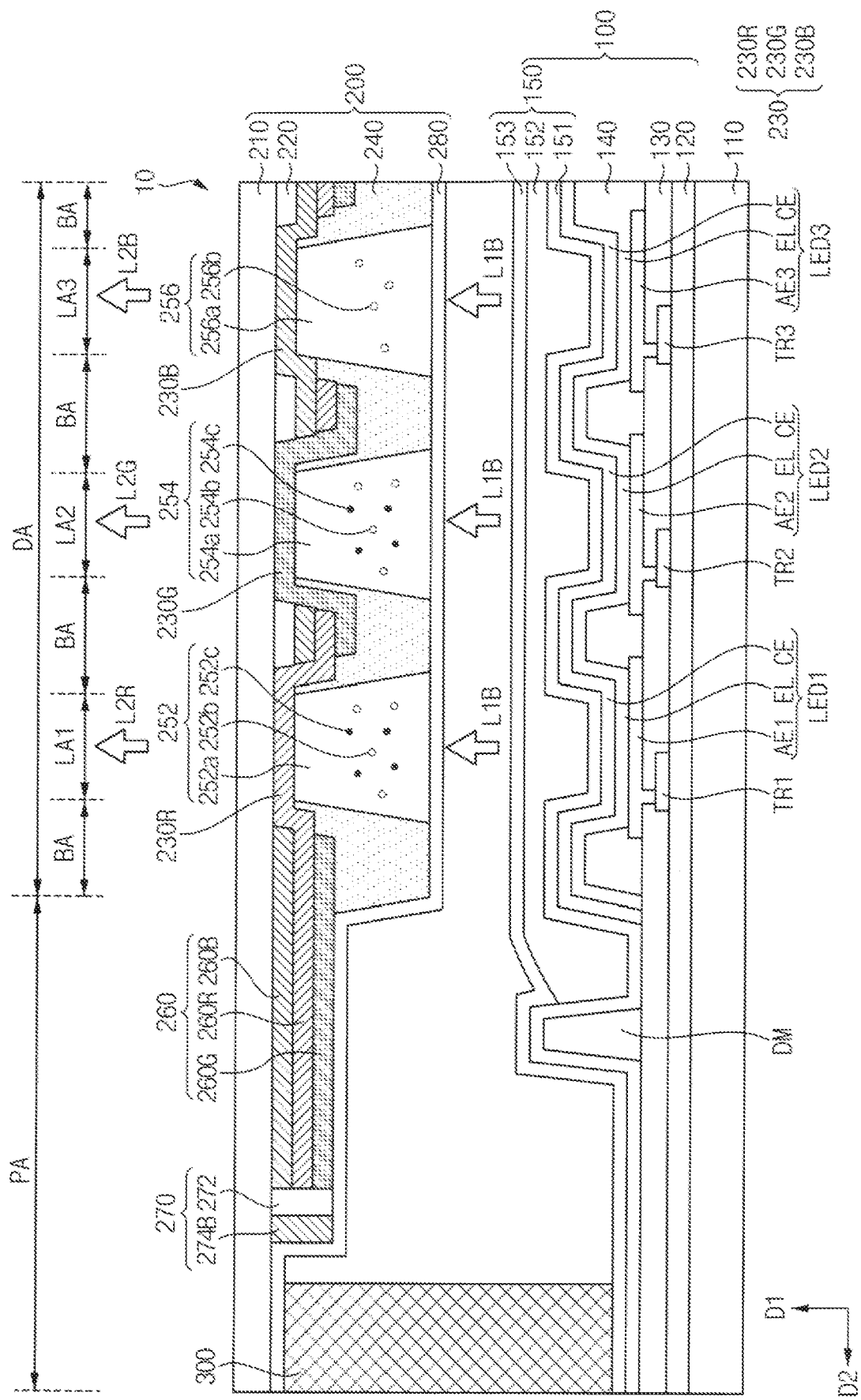
Figure 12:
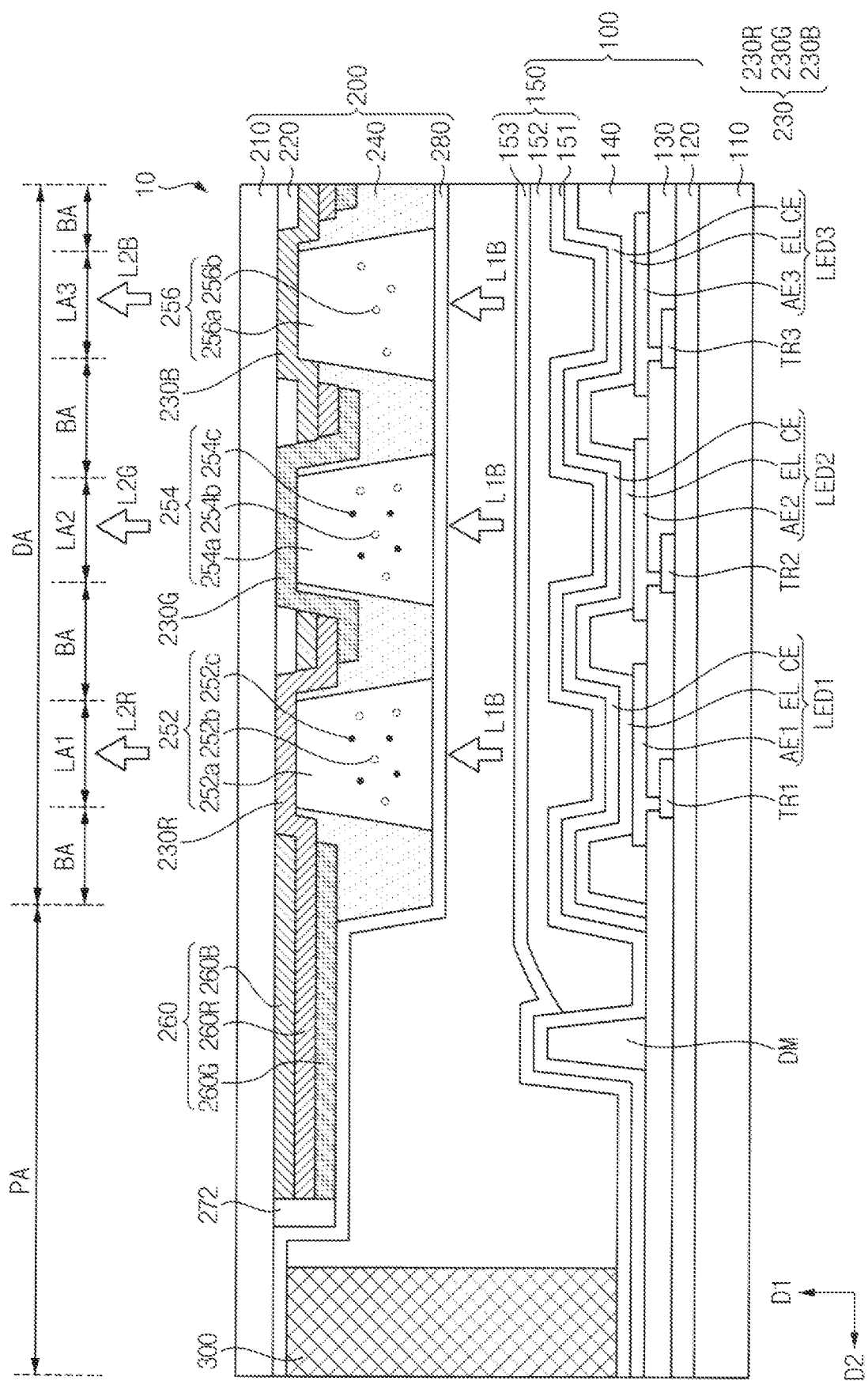

Referring to FIGS. 10 to 12, in some embodiments, at least one of the second red light blocking layer 274R, the second green light blocking layer 274G, and the second blue light blocking layer 274B may be omitted. As the side light blocking member 270 includes a smaller number of the second light blocking layers, a bezel area of the display device 10 may be reduced.

In an embodiment, when at least one of the second light blocking layers is omitted, a second light blocking layer having the same color as a first light blocking layer positioned at the lowermost portion of the first light blocking layers included in the front light blocking member 260 may be omitted. In this embodiment, the bezel area of the display device 10 may be reduced while effectively preventing or reducing the side light leakage of the display device 10.

For example, as illustrated in FIGS. 10 and 11, when the first green light blocking layer 260G is positioned at the lowermost portion of the front light blocking member 260, the second green light blocking layer 274G (FIGS. 3, 9) among the second red light blocking layer 274R, the second green light blocking layer 274G, and the second blue light blocking layer 274B may be omitted. For example, in an embodiment in which the side light blocking member 270 includes two second light blocking layers, the side light blocking member 270 may include the bank 272, the second red light blocking layer 274R, and the second blue light blocking layer 274B (FIG. 10). In an embodiment in which the side light blocking member 270 includes one second light blocking layer, the side light blocking member 270 may include the bank 272 and the second blue light blocking layer 274B (FIG. 11), or may include the bank 272 and the second red light blocking layer 274R.

In an embodiment in which the first red light blocking layer 260R is positioned at the lower most portion of the front light blocking member 260, the second red light blocking layer 274R among the second red light blocking layer 274R, the second green light blocking layer 274G, and the second blue light blocking layer 274B may be omitted. In an embodiment in which the first blue light blocking layer 260B is positioned at the lowermost portion of the front light blocking member 260, the second blue light blocking layer 274B among the second red light blocking layer 274R, the second green light blocking layer 274G, and the second blue light blocking layer 274B may be omitted.

Figure 13:
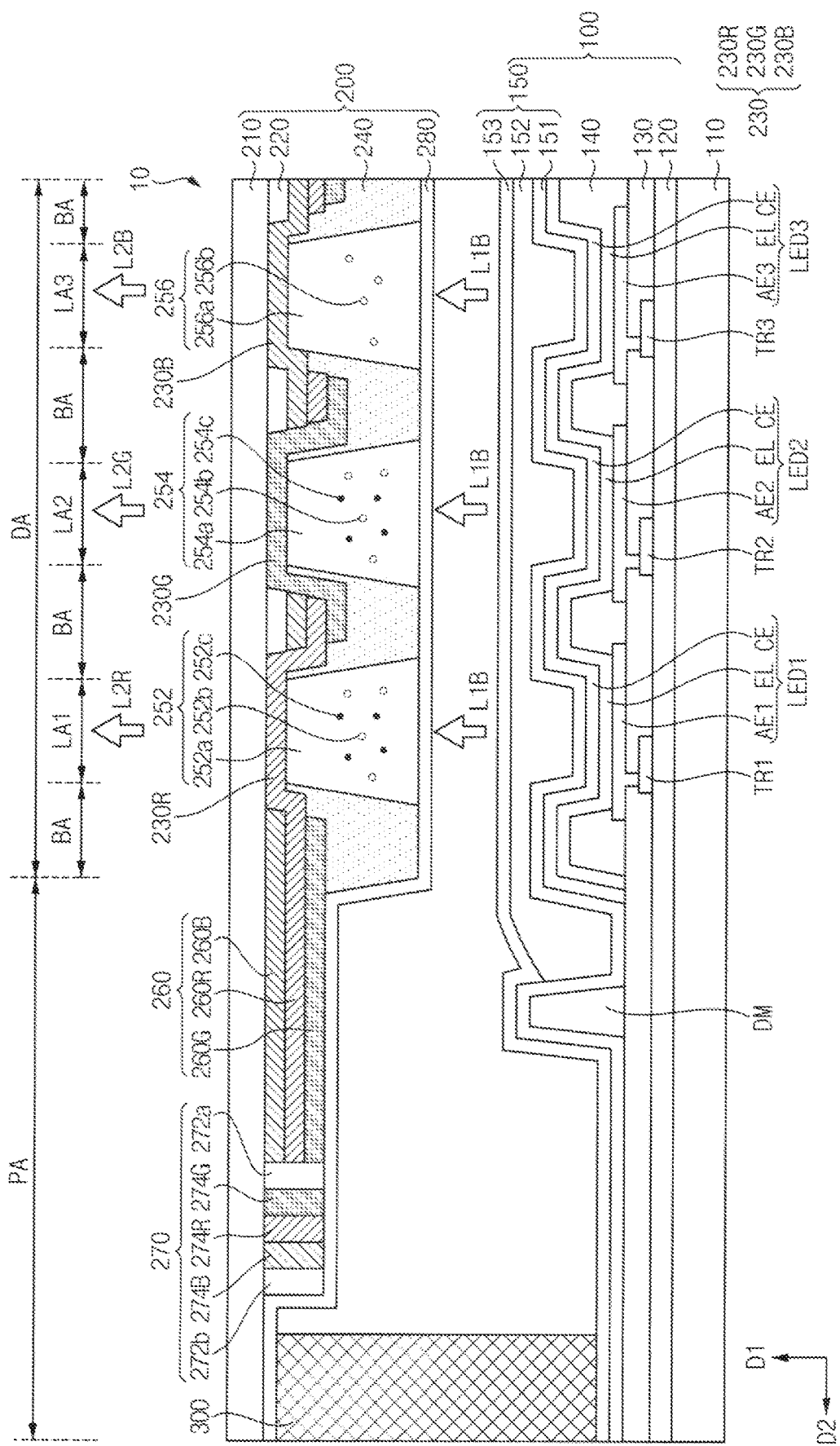

Referring to FIG. 13, in an embodiment, the side light blocking member 270 may include a first bank 272a and a second bank 272b. The first bank 272a may surround the front light blocking member 260 between the front light blocking member 260 and the second green light blocking layer 274G (e.g., in the second direction D2). The second bank 272b may be disposed outside the second blue light blocking layer 274B to surround the second blue light blocking layer 274B (e.g., in the second direction D2). In this embodiment, since the side light blocking member 270 includes a plurality of banks, the side light leakage of the display device 10 may be more effectively prevented or reduced.

Figure 14:
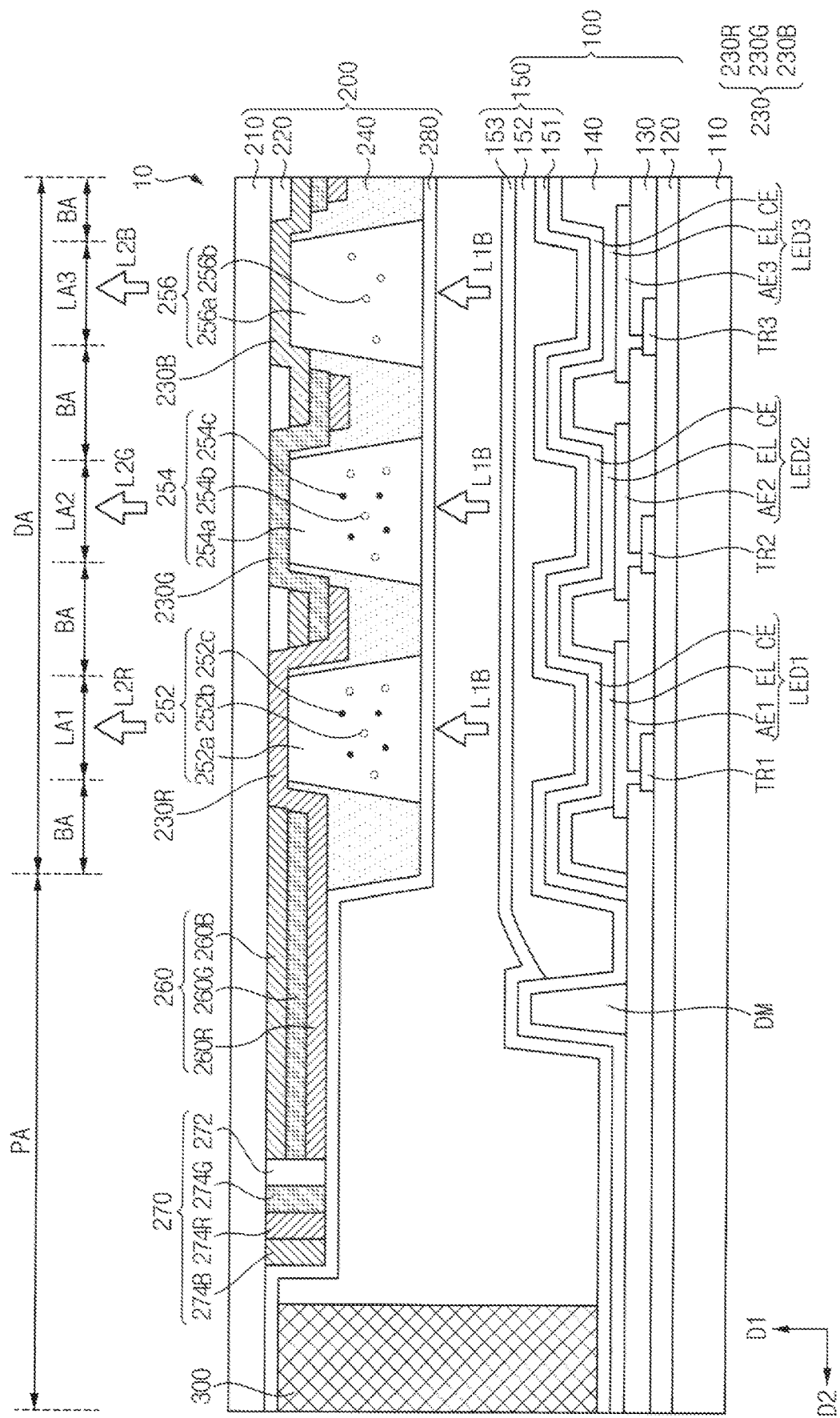

Referring to FIG. 14, in an embodiment, the first green light blocking layer 260G may be disposed between the first red light blocking layer 260R and the first blue light blocking layer 260B (e.g., in the first direction D1). For example, unlike an embodiment shown in FIG. 3, the first red light blocking layer 260R may be positioned at the lowermost portion of the front light blocking member 260. For example, the blue color filter 230B, the first blue light blocking layer 260B, and the second blue light blocking layer 274B may be formed. The green color filter 230G, the first green light blocking layer 260G, and the second green light blocking layer 274G may then be formed. The red color filter 230R, the first red light blocking layer 260R, and the second red light blocking layer 274R may then be formed. In this embodiment, even if light reflected from the circuit structure or light emitted from the display area DA passes through the front light blocking member 260 and is emitted outward direction (e.g., in the second direction D2 in FIG. 14), it is possible to emit red light having a relatively low luminance. Accordingly, the side light leakage of the display device 10 may be more effectively prevented or reduced.

Figure 15:
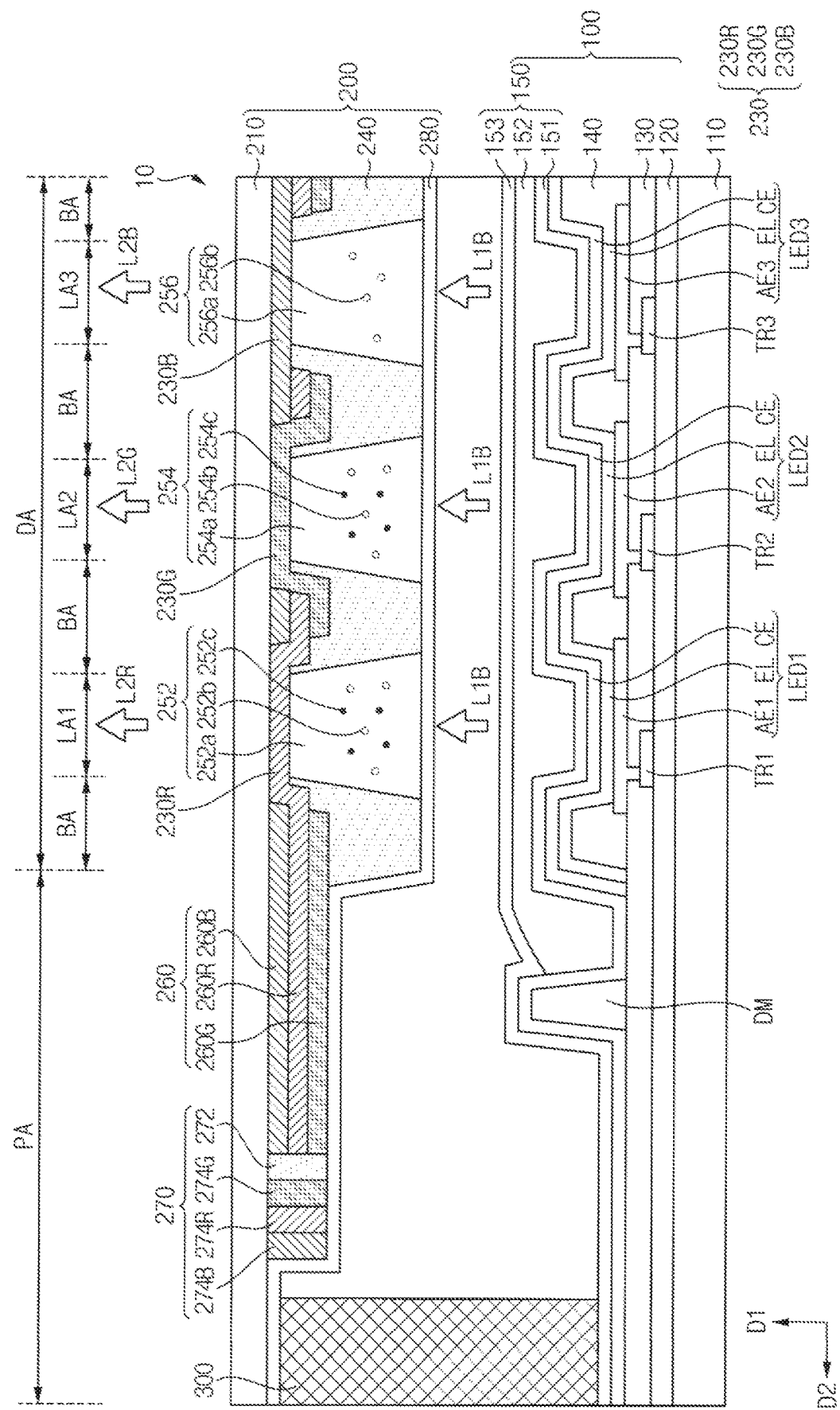

Referring to FIG. 15, in an embodiment, the bank 272 may include substantially the same material as the partition wall 240 disposed in the display area DA. In an embodiment, the bank 272 may be substantially simultaneously formed with the partition wall 240. For example, the bank 272 may be formed after the first and second light blocking layers are formed. For example, the organic layer 220 formed in the display area DA may be omitted. The side light blocking member 270 may be substantially simultaneously formed with the color filter layer 230 and the partition wall 240 formed in the display area DA of the second substrate 200. Accordingly, the manufacturing cost and manufacturing time of the display device 10 may be reduced.

Figure 16:
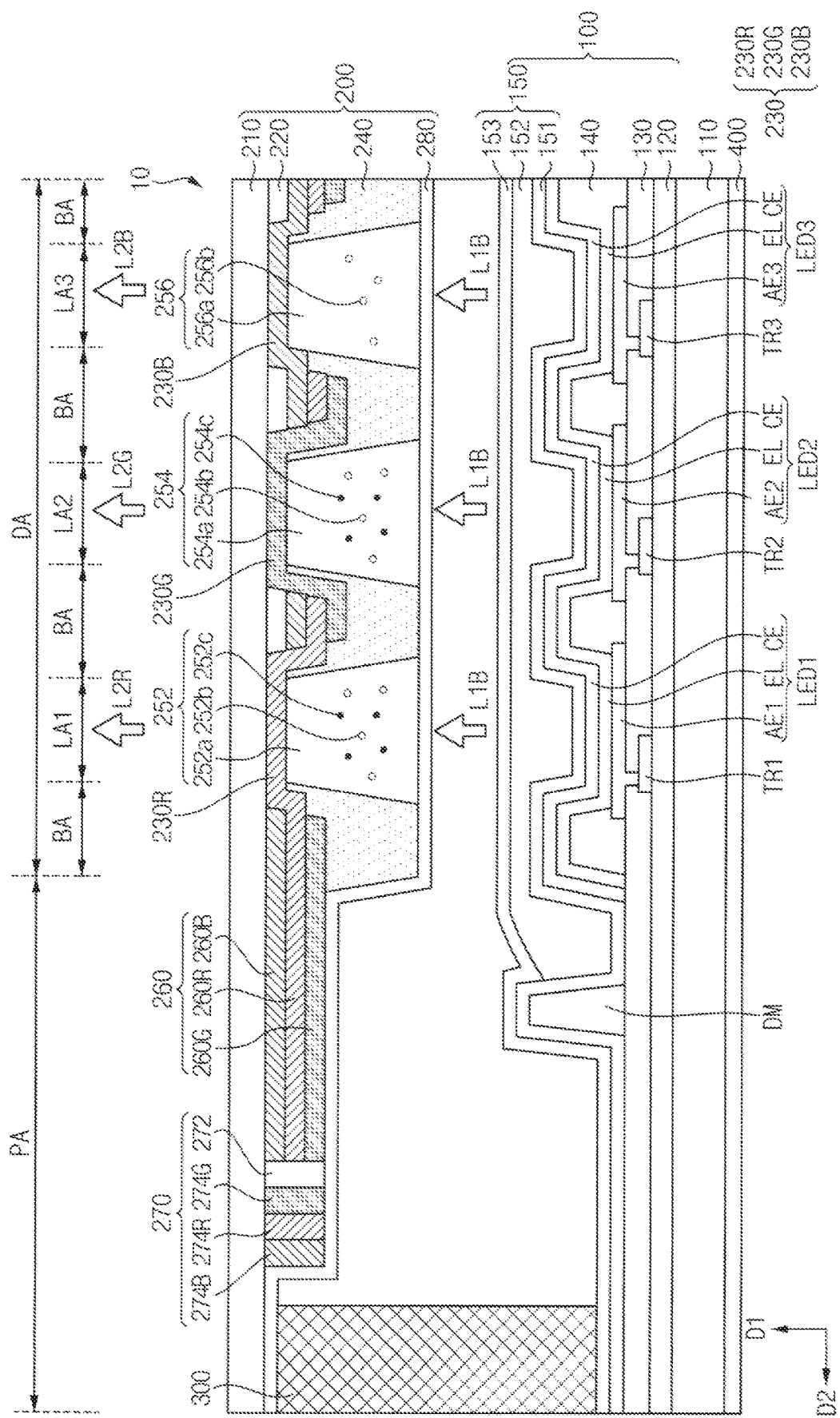

Referring to FIG. 16, in an embodiment, the display device 10 may further include an optical sheet 400 attached under the first substrate 100 (e.g., disposed directly thereon in a direction opposite to the first direction D1). The optical sheet 400 may be attached to (e.g., disposed on) a lower surface of the first base substrate 110, and may have a refractive index greater than a refractive index of the first base substrate 110. In this embodiment, total reflection of light emitted from the display area DA on the lower surface of the first base substrate 110 may be prevented or reduced. Accordingly, the side light leakage of the display device 10 may be more effectively prevented or reduced.

Figure 17:
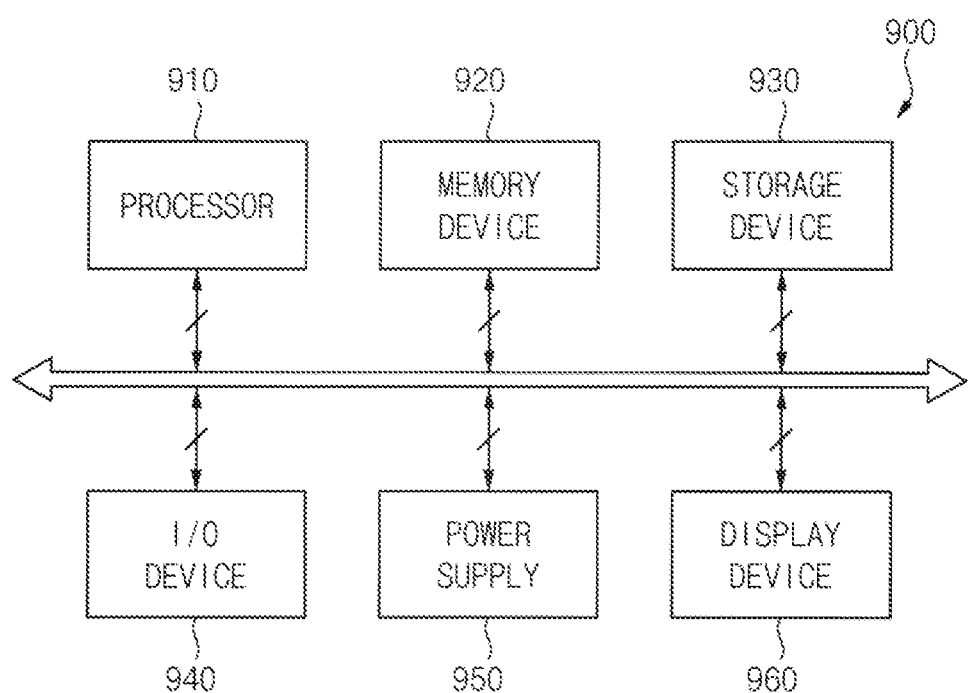
FIG. 17 is a block diagram illustrating an electronic device according to an embodiment of the present inventive concept.

FIG. 17 is a block diagram illustrating an electronic device according to an embodiment.

Referring to FIG. 17, in an embodiment, an electronic device 900 may include a processor 910, a memory device 920, a storage device 930, an input/output ("I/O") device 940, a power supply 930, and a display device 960. Here, the display device 960 may correspond to any one of the display devices of FIGS. 3, 9, 10, 11, 12, 13, 14, 15, and 16. The electronic device 900 may further include a plurality of ports for communicating with a video card, a sound card, a memory card, a universal serial bus ("USB") device, or the like, in an embodiment, the electronic device 900 may be implemented as a television. However, embodiments of the present inventive concept are not necessarily limited thereto. For example, in an embodiment, the electronic device 900 may be implemented as a smart phone. In an embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. In an embodiment, the processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

In an embodiment, the storage device 930 may include a solid state drive ("SSD") device, a hard disk drive ("HDD") device, a CD-ROM device, or the like. In an embodiment, the I/O device 940 may include an input device such as a keyboard, a keypad, a mouse device, a touchpad, a touchscreen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

Although certain embodiments and implementations have been described herein, other embodiments and modifications will be apparent from this description. Accordingly, the present inventive concept is not limited to such embodiments.

What is claimed is:

1. A color conversion substrate comprising:
   a base substrate including a display area and a peripheral area positioned around the display area;
   a color filter layer disposed in the display area under the base substrate;
   a front light blocking member disposed in the peripheral area under the base substrate and including first light blocking layers, the first light blocking layers overlapping each other in a first direction that is a thickness direction of the base substrate; and
   a side light blocking member disposed in the peripheral area under the base substrate and solely disposed outside the front light blocking member to surround the front light blocking member, wherein the side light blocking member does not overlap the front light blocking member in a plan view.

2. The color conversion substrate of claim 1, wherein:
   the color filter layer includes a red color filter, a green color filter, and a blue color filter; and
   the front light blocking member includes a first red light blocking layer, a first green light blocking layer, and a first blue light blocking layer overlapping each other in the first direction.

3. The color conversion substrate of claim 2, wherein the side light blocking member includes a first bank disposed outside the front light blocking member to surround the front light blocking member, the first bank including an organic material.

4. The color conversion substrate of claim 3, wherein a thickness of the first bank in the first direction is greater than or equal to a thickness of the front light blocking member in the first direction.

5. The color conversion substrate of claim 3, wherein:
   the display area includes light emitting areas and a light blocking area surrounding the light emitting areas;
   the color conversion substrate further comprises an organic layer disposed in the light blocking area between the base substrate and the color filter layer, the organic layer including an organic material; and
   the first bank includes a same material as the organic layer.

6. The color conversion substrate of claim 3, wherein the side light blocking member further includes at least one second light blocking layer disposed outside the first bank to surround the first bank.

7. The color conversion substrate of claim 6, wherein a thickness of the at least one second light blocking layer in the first direction is greater than or equal to a thickness of the front light blocking member in the first direction.

8. The color conversion substrate of claim 6, wherein a thickness of the second light blocking layer in the first direction is greater than a width of the second light blocking layer in a second direction perpendicular to the first direction.

9. The color conversion substrate of claim 6, wherein the at least one second light blocking layer comprises a second red light blocking layer, a second green light blocking layer, and a second blue light blocking layer overlapping each other in a second direction perpendicular to the first direction.

10. The color conversion substrate of claim 9, wherein:
    the red color filter, the first red light blocking layer, and the second red light blocking layer include a same material;
    the green color filter, the first green light blocking layer, and the second green light blocking layer include a same material; and
    the blue color filter, the first blue light blocking layer, and the second blue light blocking layer include a same material.

11. The color conversion substrate of claim 9, wherein:
    a thickness of the second red light blocking layer in the first direction is greater than a thickness of the first red light blocking layer in the first direction;
    a thickness of the second green light blocking layer in the first direction is greater than a thickness of the first green light blocking layer in the first direction; and
    a thickness of the second blue light blocking layer in the first direction is greater than a thickness of the first blue light blocking layer in the first direction.

12. The color conversion substrate of claim 6, wherein the side light blocking member includes a second bank disposed outside the at least one second light blocking layer to surround the at least one second light blocking layer, the side light blocking member including an organic material.

13. The color conversion substrate of claim 2, wherein the first green light blocking layer is disposed between the first red light blocking layer and the first blue light blocking layer in the first direction.

14. A color conversion substrate comprising:
    a base substrate including a display area and a peripheral area positioned around the display area;
    a color filter layer disposed in the display area under the base substrate;
    a front light blocking member disposed in the peripheral area under the base substrate and including first light blocking layers, the first light blocking layers having different colors from each other and overlapping each other in a first direction that is a thickness direction of the base substrate; and
    a side light blocking member disposed in the peripheral area under the base substrate and disposed outside the front light blocking member, the side light blocking member including second light blocking layers, the second light blocking layers having different colors from each other and overlapping each other in a second direction perpendicular to the first direction.

15. A display device comprising:
    a display substrate including a first base substrate and pixels disposed on the first base substrate;
    a color conversion substrate facing the display substrate; and a sealing member coupling the display substrate and the color conversion substrate to each other, wherein the color conversion substrate includes:
- a second base substrate including a display area and a peripheral area positioned around the display area;
- a color filter layer disposed in the display area under the second base substrate;
- a front light blocking member disposed in the peripheral area under the second base substrate and including first light blocking layers, the first light blocking layers overlapping each other in a first direction that is a thickness direction of the second base substrate; and
- a side light blocking member disposed in the peripheral area under the second base substrate and disposed outside the front light blocking member to surround the front light blocking member, wherein the sealing member is disposed outside the side light blocking member to surround the side light blocking member.

16. The display device of claim 15, further comprising an optical sheet disposed under the display substrate, the optical sheet having a refractive index greater than a refractive index of the first base substrate.

17. The display device of claim 15, wherein the first base substrate is black.

18. The display device of claim 15, wherein:
the front light blocking member includes a first red light blocking layer, a first green light blocking layer, and a first blue light blocking layer overlapping each other in the first direction; and
the side light blocking member includes a bank disposed outside the front light blocking member to surround the front light blocking member, the bank including an organic material.

19. The display device of claim 18, wherein:
the side light blocking member further includes a second red light blocking layer, a second green light blocking layer, and a second blue light blocking layer; and
the second red light blocking layer, the second green light blocking layer, and the second blue light blocking layer are disposed outside the bank to surround the bank and overlap each other in a second direction perpendicular to the first direction.

20. An electronic device comprising:
a display device configured to display an image;
a memory device configured to store data for the display device; and
a processor configured to perform computing functions for the display device, wherein the display device includes:
- a display substrate including a first base substrate and pixels disposed on the first base substrate;
- a color conversion substrate facing the display substrate; and
- a sealing member coupling the display substrate and the color conversion substrate to each other, wherein the color conversion substrate includes:
- a second base substrate including a display area and a peripheral area positioned around the display area;
- a color filter layer disposed in the display area under the second base substrate;
- a front light blocking member disposed in the peripheral area under the second base substrate and including first light blocking layers, the first light blocking layers overlapping each other in a first direction that is a thickness direction of the second base substrate; and
- a side light blocking member disposed in the peripheral area under the second base substrate and solely disposed outside the front light blocking member to surround the front light blocking member, wherein the side light blocking member does not overlap the front light blocking member in a plan view.

* * * * *